(12) United States Patent
Ahmed

(10) Patent No.: US 11,676,529 B2
(45) Date of Patent: Jun. 13, 2023

(54) METHODS AND APPARATUS FOR IN-PIXEL DRIVING OF MICRO-LEDS

(71) Applicant: Intel Corporation, Santa Clara, CA (US)

(72) Inventor: Khaled Ahmed, Anaheim, CA (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 16/726,200

(22) Filed: Dec. 23, 2019

(65) Prior Publication Data

US 2020/0135092 A1 Apr. 30, 2020

(51) Int. Cl.
G09G 3/32 (2016.01)
H01L 27/12 (2006.01)
H01L 25/075 (2006.01)

(52) U.S. Cl.
CPC .......... G09G 3/32 (2013.01); H01L 25/0753 (2013.01); H01L 27/1214 (2013.01); G09G 2330/021 (2013.01)

(58) Field of Classification Search
CPC .............. G09G 3/32; G09G 2330/021; H01L 25/0753; H01L 27/1214
See application file for complete search history.

(56) References Cited

U.S. PATENT DOCUMENTS

| 10,902,769 | B2 * | 1/2021 | Pappas | .................. H01L 25/167 |
| 2006/0238243 | A1 * | 10/2006 | Tsuchi | ............... H03F 3/45183 |
| | | | | 330/51 |
| 2015/0194097 | A1 * | 7/2015 | Mariano | .................. G09G 3/32 |
| | | | | 345/690 |
| 2017/0110068 | A1 * | 4/2017 | Lee | .......................... G09G 3/342 |
| 2017/0330301 | A1 * | 11/2017 | Kuraki | .................. G06T 1/0064 |
| 2019/0157910 | A1 * | 5/2019 | Choi | ..................... G09G 3/2096 |
| 2021/0175220 | A1 * | 6/2021 | Feng | ........................ H01L 33/40 |
| 2021/0217352 | A1 * | 7/2021 | Xuan | ....................... G09G 3/32 |

OTHER PUBLICATIONS

Chang et al., "LTPO TFT Technology for AMOLEDs," Invited Paper, SID 2019 Digest, May 29, 2019, 4 pages.
Sugiura et al., "12.1-inch 169-ppi Full-Color Micro-LED Display Using LTPS-1F I Backplane," Invited Paper, AU Optronics Corporation, Hsinchu, Taiwan R.O.C., SID 2019 Digest, May 29, 2019, 4 pages.
Freitas et al., "A simple high-gain CMOS voltage comparator circuit," International Journal of Electronics, 1984, 5 pages.
Kim et al., "PWM Pixel Circuit with LTPS TFTs for Micro-LED Displays," SID 2019 Digest, May 29, 2019, 4 pages.

(Continued)

*Primary Examiner* — Abbas I Abdulselam
(74) *Attorney, Agent, or Firm* — Hanley, Flight & Zimmerman, LLC

(57) ABSTRACT

Methods and apparatus for in-pixel driving of micro-light-emitting diodes are disclosed. An example light-emitting diode driver includes a first input node to receive a data signal, a second input node to receive a reference signal having a first frequency, and a driver circuit including thin-film transistors to output a current pulse for driving a light-emitting diode, the current pulse having a width based on the data signal and the reference signal, the output signal having a second frequency that is greater than the first frequency.

22 Claims, 16 Drawing Sheets

(56) References Cited

OTHER PUBLICATIONS

Biwa et al., "The Technologies for Crystal LED Display System," May 29, 2019, 4 pages.
Kim et al., "P-51: a-IGZO TFT Based Operational Amplifier and Comparator Circuits for the Adaptive DC-DC Converter," Society for Information Display (SID), Jun. 2014, vol. 45, Issue 1, pp. 1164-1167. Abstract only.

* cited by examiner

METHODS AND APPARATUS FOR IN-PIXEL DRIVING OF MICRO-LEDS

FIELD OF THE DISCLOSURE

This disclosure relates generally to micro-LEDs, and, more particularly, to methods and apparatus for in-pixel driving of micro-LEDS.

BACKGROUND

In recent years, micro-light-emitting diode (LED) display technology has been the focus of considerable research and development. Among other advantages, micro-LED displays provide promising results in delivering bright colors and rich black levels while consuming three to five times less power than organic LED (OLED) displays.

Figure 1:
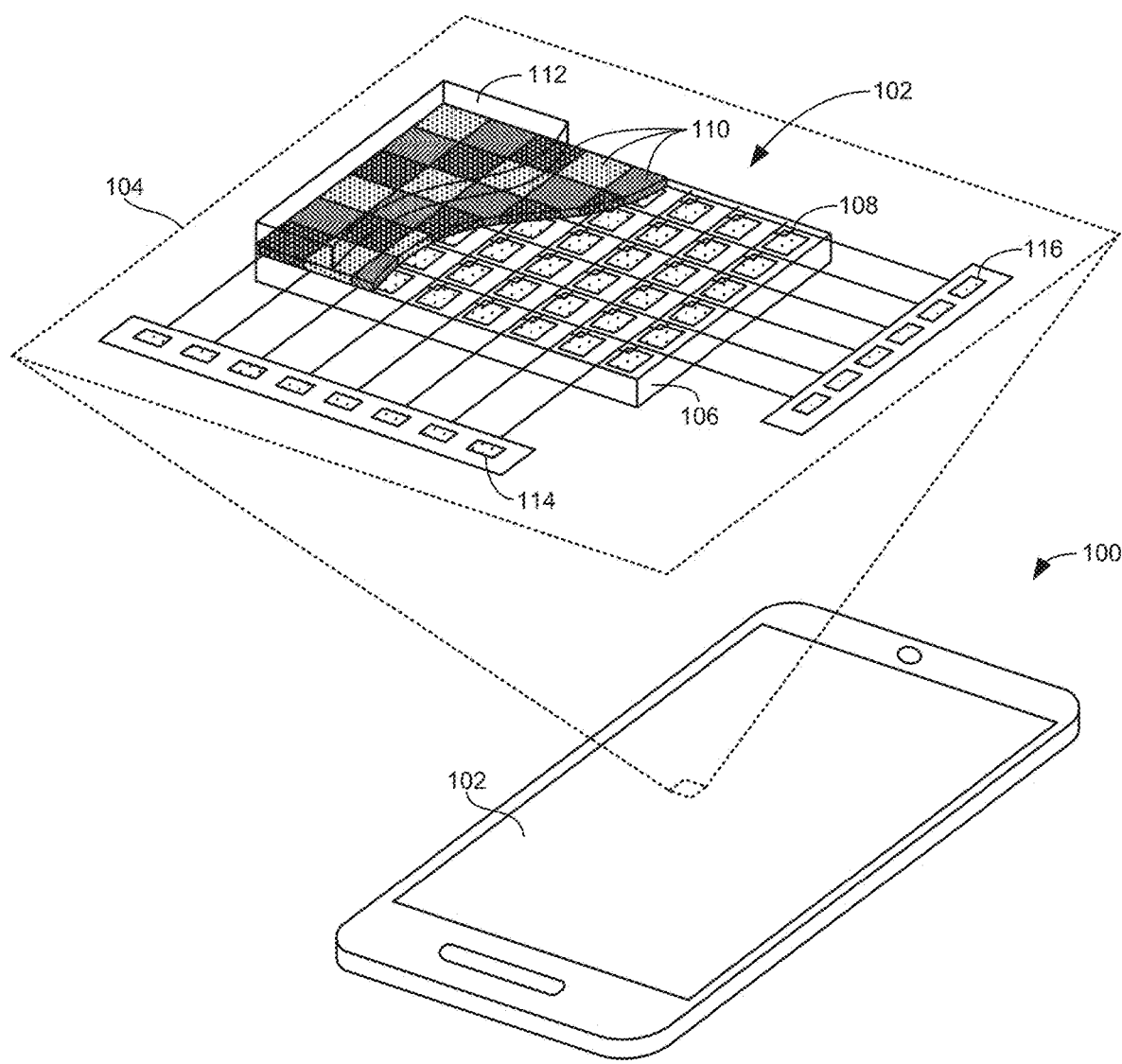
FIG. 1 illustrates an example electronic device with a micro-LED display constructed in accordance with teachings disclosed herein.

The figures are not to scale. Instead, the thickness of the layers or regions may be enlarged in the drawings. In general, the same reference numbers will be used throughout the drawing(s) and accompanying written description to refer to the same or like parts. As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween. Connection references (e.g., attached, coupled, connected, and joined) are to be construed broadly and may include intermediate members between a collection of elements and relative movement between elements unless otherwise indicated. As such, connection references do not necessarily infer that two elements are directly connected and in fixed relation to each other. Stating that any part is in "contact" with another part means that there is no intermediate part between the two parts. Although the figures show layers and regions with clean lines and boundaries, some or all of these lines and/or boundaries may be idealized. In reality, the boundaries and/or lines may be unobservable, blended, and/or irregular.

Descriptors "first," "second," "third," etc. are used herein when identifying multiple elements or components which may be referred to separately. Unless otherwise specified or understood based on their context of use, such descriptors are not intended to impute any meaning of priority, physical order or arrangement in a list, or ordering in time but are merely used as labels for referring to multiple elements or components separately for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for ease of referencing multiple elements or components.

As used herein, the term "above" is used with reference to a bulk region of a base semiconductor substrate (e.g., a semiconductor wafer) on which components of an integrated circuit and/or other semiconductor devices are formed. Specifically, as used herein, a first component of an integrated circuit is "above" a second component when the first component is farther away from the bulk region of the semiconductor substrate. Likewise, as used herein, a first component is "below" another component when the first component is closer to the bulk region of the semiconductor substrate. As noted above, one component can be above or below another with other components therebetween or while being in direct contact with one another.

DETAILED DESCRIPTION

Micro-LED arrays produce their own light in response to current flowing through the individual micro-LED elements of the array. Electrically, micro-LED devices include inorganic structures that look like diodes with typical forward "on" voltage drops ranging from 1.9 volts (V) to 3 V depending on the color displayed. Unlike liquid crystal displays (LCDs), micro-LEDs are current driven devices. However, like common LCD panels, micro-LEDs may be arranged in a 2 dimensional array (matrix) of elements to form a display. Unlike organic LED (OLED) elements, micro-LED elements utilize inorganic compounds such as gallium nitride that are illuminated when supplied with current as opposed to organic compounds that are illuminated in OLED displays. As used herein, the term micro-LED is not limited to a specific LED dimension. However, in some examples, the micro-LEDs have a dimension (e.g., a length and/or a width) that is less than 100 micrometers. For example, in some instances the micro-LEDs have a size that is less than or equal to 100 micrometers by 100 micrometers. In some in some examples, the micro-LEDs have a size that is less than or equal to 30 micrometers by 30 micrometers.

Active-matrix micro-LED displays use current control circuits integrated with the display itself, with one control circuit corresponding to each individual element on the substrate, to create high-resolution color graphics with a high refresh rate. This structure results in a matrix of devices, one (or more) device formed at each point where a row overlies a column. There will generally be at least M×N devices in a matrix having M rows and N columns. Typical micro-LED devices function like standard LEDs, which conduct current and luminesce when voltage of one polarity is imposed across them, and block current when voltage of the opposite polarity is applied.

To control individual micro-LED devices located at matrix junctions, it is useful to have two distinct driver circuits, one to drive the columns and one to drive the rows. It is conventional to sequentially scan the rows (typically conventionally connected to device cathodes) with a driver switch to a known voltage such as ground, and to provide another driver to drive the columns (which are typically conventionally connected to device anodes). In operation, information is transferred to the matrix display by scanning each row in sequence. During each row scan period, each column connected to an element intended to emit light is also driven.

To produce the perception of a grayscale or a full-color image using a micro-LED display at optimal power efficiency, it is necessary to rapidly modulate the pixels of the display between on and off states such that the average of their modulated brightness waveforms correspond to the desired 'analog' brightness for each pixel. This technique is generally referred to as pulse-width modulation (PWM). Above a certain modulation frequency, the human eye and brain integrate a pixel's rapidly varying brightness (and color, in a field-sequential color display) and perceive a brightness (and color) determined by the pixel's average illumination over a period of time (e.g., over a display of a video frame).

PWM operation of micro-LEDs provides improvements in power efficiency when compared with analog driving. For example. the power efficacy of solid-state micro-LEDs drops significantly at very low current density (<1 A/cm2). This drop in efficacy can cause undesired high power consumption. The power efficacy typically peaks at a current density of ~1 A/cm2. Typical operating conditions use a current density of ~0.1 A/cm2 for display applications. At this low current level, the power efficacy is smaller than its optimal (peak) value. Similarly, driving micro-LEDs using pulses sent from column drivers across whole display lengths can cause undesired high power consumption and pulse distortion.

To address the drawbacks of analog circuits or PWM signals sent from column drivers across long traces, some micro-LED implementations include PWM circuits for each pixel implemented in silicon (Si) complementary metal-oxide-semiconductor (CMOS) and transferred from silicon wafers to a backplane. While this technique may work for large displays that include large pixels (e.g., televisions), as the pixel size decreases, such techniques become infeasible to make small enough for products such as laptops and smartphones due to the transistor count of the circuits when implemented with thin-film transistor (TFT) technology.

Examples disclosed herein, utilize in-pixel circuits to convert a low-frequency driving signal (e.g., a sawtooth or triangular pulse) sent from a column driver into a pulse-width modulated circuit to drive micro-LEDs. In some examples, the image data to be displayed is represented by a DC voltage that is produced by a digital-to-analog converter (DAC). The input to the DAC may be provided by a timing control (TCON) circuit. In some examples, the in-pixel circuit includes eight TFTs: four n-channel TFTs and four p-channel TFTs. In some examples the n-channel TFTs may be implemented by Low Temperature PolySilicon (LTPS) and indium gallium zinc oxide (IGZO) TFTs. In some examples, the four n-channel TFTS may be implemented by LTPS TFTS. In some examples disclosed herein, the micro-LEDs may be driven a current levels that provide high efficiency outputs driven by PWMs. In such circuits, the PWM signals may be generated at the pixel without the distortion and high power consumption associated with transmitting high frequency PWM signals across an entire display. Instead, examples disclosed herein utilize a lower frequency signal to drive the in-pixel circuit that generates the higher frequency PWM signal.

FIG. 1 illustrates an example electronic device 100 with a micro-LED display 102 constructed in accordance with teachings disclosed herein. The electronic device 100 may be any type of electronic device that includes a display such as a laptop, a tablet, a smartphone, a smartwatch, a television, a computer monitor, etc. The illustrated example of FIG. 1 also includes a partially cutaway close up 104 of a portion of the micro-LED display 102. As shown in the illustrated example, the display 102 includes an underlying substrate 106 that carries a plurality of transistor-based in-pixel driver circuits 108 with a grid of wires used to drive the individual in-pixel driver circuits 108 and, thereby, pixels (or subpixels) of the display 102.

According to the illustrated examples, the pixel driver circuits are implemented using TFTs applied to the substrate 106. Example implementations of the in-pixel driver circuits 108 are described in conjunction with FIGS. 2, 3, and 8-16.

In the illustrated example, an array of red, green, and blue micro-LEDs 110 are electrical coupled to the in-pixel driver circuits 108. As mentioned above, ins some examples, the micro-LEDs 110 of the display 102 may also include infrared micro-LEDs. Each individual micro-LED 110 corresponds to a different pixel (or subpixel) of the display that is driven by the in-pixel driver circuit 108. On top of the micro-LEDs 110 (opposite the substrate 106 and the in-pixel driver circuits 108) is a transparent conductive film 112.

The example pixel driver circuits 108 are driven by column drivers 114 and row drivers 116. For example, the column drivers 114 supply a low frequency signal (e.g., a sawtooth wave signal, a triangular/triangle wave signal, etc.) while the row drivers 116 supply a scan signal to selectively pass a data signal representative of an image to be displayed to activate the pixels of particular row of the display 102. For example, the data signal may be supplied to the display 102 from a digital to analog (DAC) to drive the display 102 to display an image initially represented in digital data. The example in-pixel driver circuits 108 convert the low frequency signal into a higher frequency PWM signal having a pulse that is based on the DC voltage of the input data signal. According to the illustrated example, the amplitude of the PWM signal is fixed at a level that drives the micro-LEDs 110 at efficient operating current and the brightness and/or color of the micro-LEDs 110 is controlled by the pulse width of the PWM signal.

Figure 2:
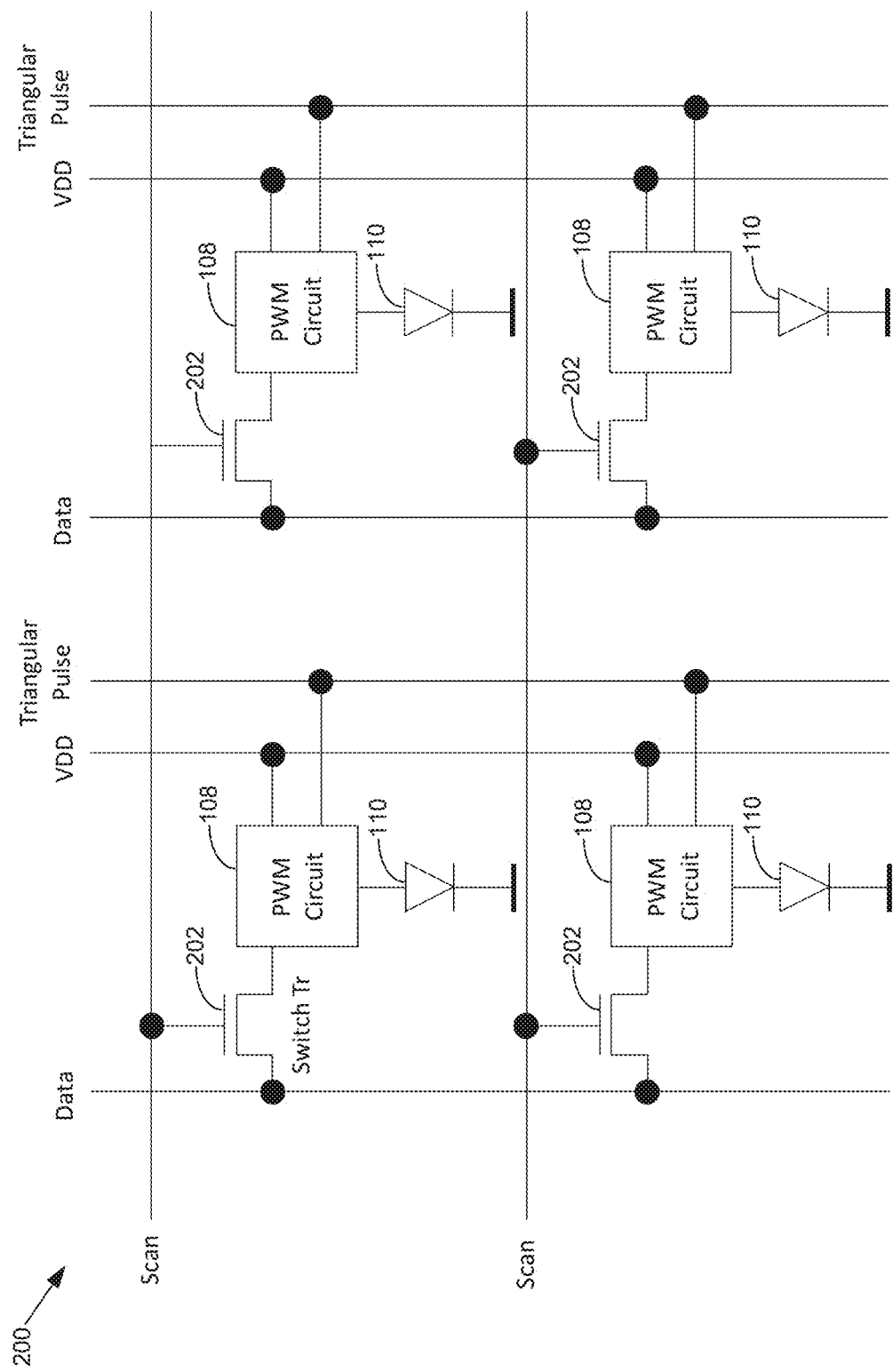
FIG. 2 is a block diagram of an example implementation of the in-pixel driver circuits of FIG. 1 to drive the example micro-LEDs.

FIG. 2 is a block diagram of an example implementation of the in-pixel driver circuits 108 to drive the example micro-LEDs 110. The example in-pixel driver circuits 108 are coupled to the example micro-LEDs 110. The example in-pixel driver circuits 108 are coupled to data signals via respective switching transistors 202. The switching transistors 202 are operated by scanning signals (e.g., supplied by the example row drivers 116). The example switching transistors 202 are N-channel TFT transistors. While the example of FIG. 2 illustrates an example 2×2 matrix of micro-LEDs 110, any number and dimension of micro-LEDs 110 may be implemented in an example (e.g., a 1080p display may include a matrix of 1,920 columns and 1,080 rows of micro-LEDs 110). Furthermore, while a single micro-LED 110 is shown for each in-pixel driving circuit 108, multiple micro-LEDs 110 may be connected to the in-pixel driving circuit 108 in parallel (e.g., to provide redundancy in case one micro-LED 108 is defective or otherwise fails to operate).

In operation, data signals having a DC values representative of pixels to be displayed are supplied to columns of switching transistors 202 (e.g., a first data signal is supplied to a first column and a second data signal is supplied to a second column). The row corresponding to the supplied data signals (e.g., a first row to be scanned) is supplied with a scanning signal that activates the switching transistors 202 of the row to supply the data signals to the in-pixel driver circuits 108 of the row. The example in-pixel driver circuits 108 convert triangular signals (e.g., supplied by the example column drivers 114) into PWM signals having respective pulses based on the amplitude of the supplied data signals. The PWM signals are supplied to the example micro-LEDs 110.

Figure 3:
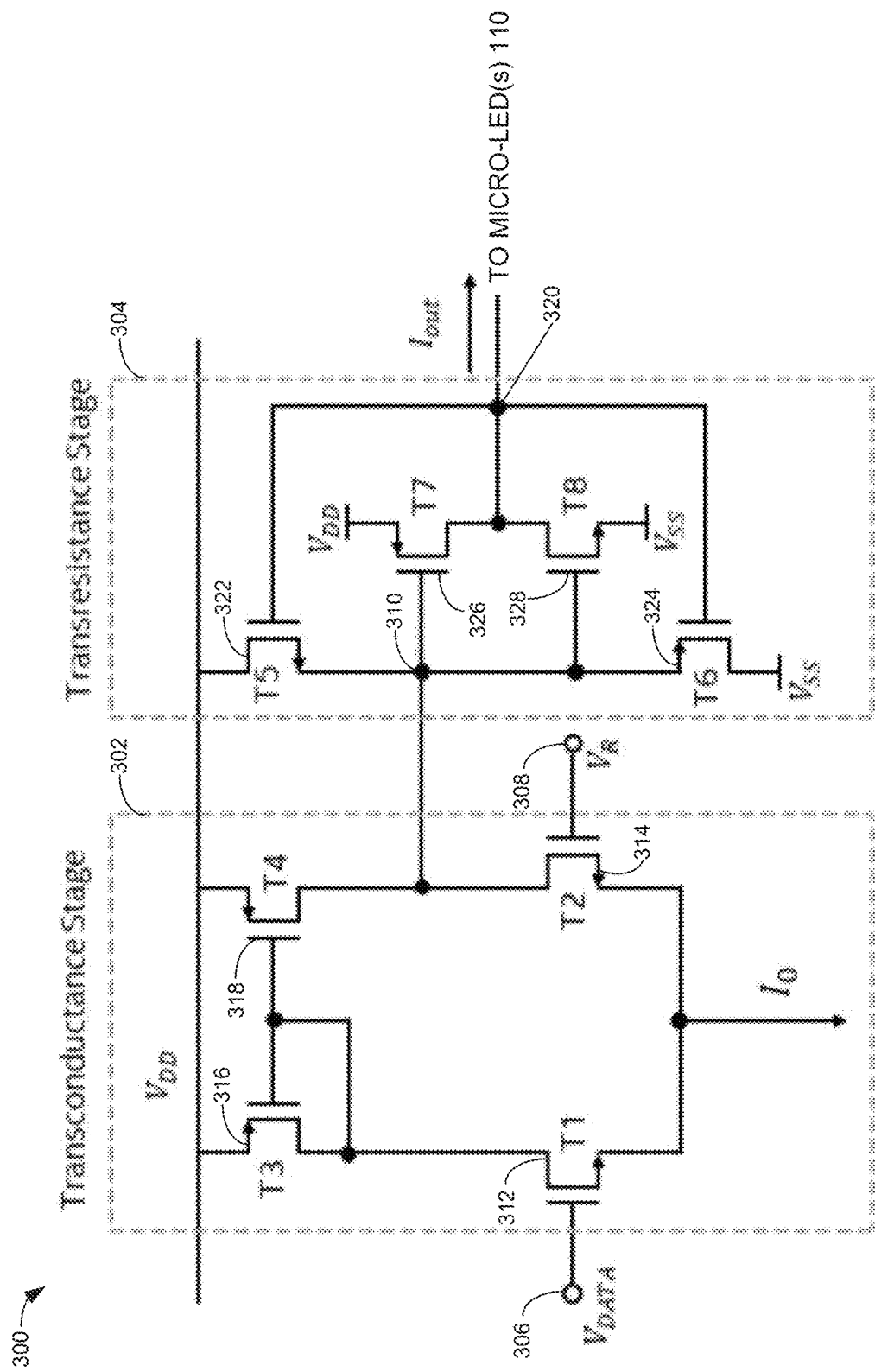
FIGS. 3 and 14-16 illustrate example circuits that may be utilized to implement the example in-pixel driver circuit of FIGS. 1 and/or 2.

An example circuit 300 that may be utilized to implement the example in-pixel driver circuits 108 of FIGS. 1 and/or 2 is illustrated in FIG. 3. The example circuit 300 of FIG. 3 includes an example transconductance stage 302 and an example transresistance stage 304.

The example transconductance stage 302 senses a first input voltage at a first input node 306 and a second input voltage at a second input node 308. The transconductance stage 302 generates a current at a feedback node 310 into the example transresistance stage 304.

The example transconductance stage 302 of FIG. 3 includes a first transistor 312 and a second transistor 314 arranged as a differential pair/differential amplifier biased by a current mirror implemented by a third transistor 316 and a fourth transistor 318. If the first input voltage at the first input node 306 is greater than the second input voltage at the second input node 308, a current through the first transistor 312 is greater than a current through the second transistor 314. The current mirror (the third transistor 316 and the fourth transistor 318) forces the current difference to an external circuit coupled to the feedback node 310.

The example transresistance stage 304 senses the current into the feedback node 310 and generates an output current pulse at the output node 320 that indicates which of the first input voltage or the second input voltage has a greater magnitude. The output current pulse 320 is a PWM signal that is supplied to the micro-LEDs 110, respectively. Example implementations of the output current pulse 320 are described in conjunction with FIGS. 5 and 6.

The voltage generated by the transconductance amplifier at the feedback node 310 is clamped by the transresistance stage 304. The example transresistance stage 304 includes an example fifth transistor 322, an example sixth transistor 324, an example seventh transistor 326, an example eighth transistor 328. In some examples, gate width-to-length ratios of the example seventh transistor 326 and the example eight transistor 328 are adjusted to set a CMOS inverter switching threshold near the center of the common mode output range of the differential pair (the first transistor 312 and the second transistor 314).

According to the illustrated example, the transistors 312, 314, 322, and 328 are n-channel TFTs and the transistors 316, 318, 324, and 326 are p-channel TFTs. The example N-channel TFTs may be made of low-temperature polycrystalline oxide (LTPO), low temperature polycrystalline silicon (LTPS), indium phosphide (InP), gallium phosphide (GaP), gallium nitride (GaN), or indium gallium zinc oxide (IGZO) think-film transistors and the example p-channel TFTs may be made of low-temperature polycrystalline oxide (LTPO), low temperature polycrystalline silicon (LTPS), indium phosphide (InP), gallium phosphide (GaP), or gallium nitride (GaN).

According to the illustrated example, the example first input voltage 312 is a DC voltage that represents image data for a particular subpixel to be activated. The example second input voltage 308 is a sawtooth signal (or another low frequency signal). An example method for determining the frequency of the second input voltage 308 based on a frame rate and a number of rows of the display 102 is described in conjunction with FIG. 4.

According to the illustrated example of FIG. 3, a gate of the first transistor 312 is coupled to the first input node 306 and a gate of the second transistor 314 is coupled to the second input node 308. A drain of the first transistor 312 is coupled to a gate and a drain of the third transistor 316 and a gate of the fourth transistor 318 of the current mirror circuit. A drain of the second transistor 314 is coupled to the drain of the fourth transistor and to the feedback node 310. The supply of third transistor 316 and the supply of the fourth transistor 318 are coupled to a supply voltage.

The example fifth transistor 322 includes a drain coupled to a supply voltage, a supply coupled to the feedback node, and a gate connected to the output node 320. The example sixth transistor 324 includes a supply connected to the feedback node 310, a gate coupled to the output node 320, and a drain connected to 0V potential. The seventh transistor 326 includes a supply connected to the supply voltage, a gate connected to the feedback node 310, and a drain connected to the output node 320. The eighth transistor 328 includes a drain connected to the output node 320, a gate connected to the feedback node 310, and a supply connected to 0V potential.

While an example manner of implementing the in-pixel driver circuit 108 is illustrated in FIGS. 2 and/or 3, one or more of the elements, processes and/or devices illustrated in FIGS. 2 and/or 3 may be combined, divided, re-arranged, omitted, eliminated and/or implemented in any other way. For example, additional circuit implementations of the in-pixel driver circuit 108 are described in conjunction with FIGS. 8-16.

Figure 4:
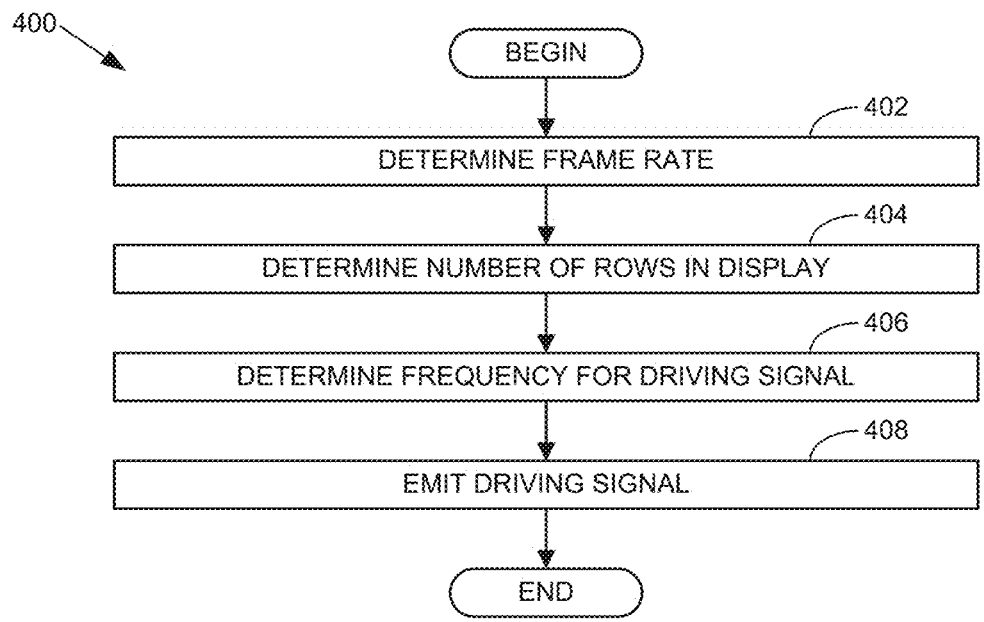
FIG. 4 is a flowchart representative of an example machine readable instructions to generate a driver reference signal for the in-pixel driver circuit of FIGS. 1-3 and/or 14-16.

A flowchart representative of example hardware logic, machine readable instructions, hardware implemented state machines, and/or any combination thereof for implementing the column drivers 114 to supply low frequency signals to the in-pixel driver circuits 108 is shown in FIG. 4. The machine readable instructions may be one or more executable programs or portion(s) of an executable program for execution by a computer processor such as the processor 1712 shown in the example processor platform 1700 discussed below in connection with FIG. 17. The program may be embodied in software stored on a non-transitory computer readable storage medium such as a CD-ROM, a floppy disk, a hard drive, a DVD, a Blu-ray disk, or a memory associated with the processor 1712, but the entire program and/or parts thereof could alternatively be executed by a device other than the processor 1712 and/or embodied in firmware or dedicated hardware. Further, although the example program is described with reference to the flowchart illustrated in FIG. 4, many other methods of implementing the example column drivers 114 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

The machine readable instructions described herein may be stored in one or more of a compressed format, an encrypted format, a fragmented format, a compiled format, an executable format, a packaged format, etc. Machine readable instructions as described herein may be stored as data (e.g., portions of instructions, code, representations of code, etc.) that may be utilized to create, manufacture, and/or produce machine executable instructions. For example, the machine readable instructions may be fragmented and stored on one or more storage devices and/or computing devices (e.g., servers). The machine readable instructions may require one or more of installation, modification, adaptation, updating, combining, supplementing, configuring, decryption, decompression, unpacking, distribution, reassignment, compilation, etc. in order to make them directly readable, interpretable, and/or executable by a computing device and/or other machine. For example, the machine readable instructions may be stored in multiple parts, which are individually compressed, encrypted, and stored on separate computing devices, wherein the parts when decrypted, decompressed, and combined form a set of executable instructions that implement a program such as that described herein.

In another example, the machine readable instructions may be stored in a state in which they may be read by a computer, but require addition of a library (e.g., a dynamic link library (DLL)), a software development kit (SDK), an application programming interface (API), etc. in order to execute the instructions on a particular computing device or other device. In another example, the machine readable instructions may need to be configured (e.g., settings stored, data input, network addresses recorded, etc.) before the machine readable instructions and/or the corresponding program(s) can be executed in whole or in part. Thus, the disclosed machine readable instructions and/or corresponding program(s) are intended to encompass such machine readable instructions and/or program(s) regardless of the particular format or state of the machine readable instructions and/or program(s) when stored or otherwise at rest or in transit.

The machine readable instructions described herein can be represented by any past, present, or future instruction language, scripting language, programming language, etc. For example, the machine readable instructions may be represented using any of the following languages: C, C++, Java, C#, Perl, Python, JavaScript, HyperText Markup Language (HTML), Structured Query Language (SQL), Swift, etc.

The program 400 of FIG. 4 operates to emit a driving signal to the in-pixel driver circuit 108 of FIGS. 1, 2, and/or 3. According to the illustrated example, the driving signal is a low frequency sawtooth/triangular wave signal. Alternatively, other signals may be utilized.

As mentioned above, the example processes of FIG. 4 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C. As used herein in the context of describing structures, components, items, objects and/or things, the phrase "at least one of A and B" is intended to refer to implementations including any of (1) at least one A, (2) at least one B, and (3) at least one A and at least one B. Similarly, as used herein in the context of describing structures, components, items, objects and/or things, the phrase "at least one of A or B" is intended to refer to implementations including any of (1) at least one A, (2) at least one B, and (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, and (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, and (3) at least one A and at least one B.

As used herein, singular references (e.g., "a", "an", "first", "second", etc.) do not exclude a plurality. The term "a" or "an" entity, as used herein, refers to one or more of that entity. The terms "a" (or "an"), "one or more", and "at least one" can be used interchangeably herein. Furthermore, although individually listed, a plurality of means, elements or method actions may be implemented by, e.g., a single unit or processor. Additionally, although individual features may be included in different examples or claims, these may possibly be combined, and the inclusion in different examples or claims does not imply that a combination of features is not feasible and/or advantageous.

The example program 400 begins when the example column driver 114 determines a frame rate for the display 102 (block 402). For example, the frame rate may be a fixed value for the display 102, may be a variable value set by a user setting of the display 102, may be selected based on a frame rate of content to be displayed on the display 102, etc.

The example column driver 114 determines a number of rows for the display (block 404). The number of rows for the display is typically fixed and may be stored as a fixed parameter. Alternatively, if the display is adjusted to utilize a variable number of rows (e.g., part of the display 102 may be disabled), the number of rows may be a variable value.

The example column driver 114 determines a frequency for the driving signal based on the determined frame rate and the determined number of rows in the display (block 406). According to the illustrated example, the frequency of the driving signal (e.g., a triangular wave signal) is determined as the number of rows for the display multiplied by the frame rate.

The example column driver 114 then emits the driving signal having the determined frequency to a column of the in-pixel driver circuits 108 (block 408). According to the illustrated example, the driving signal is emitted whenever the display 102 is operated.

Figure 5:
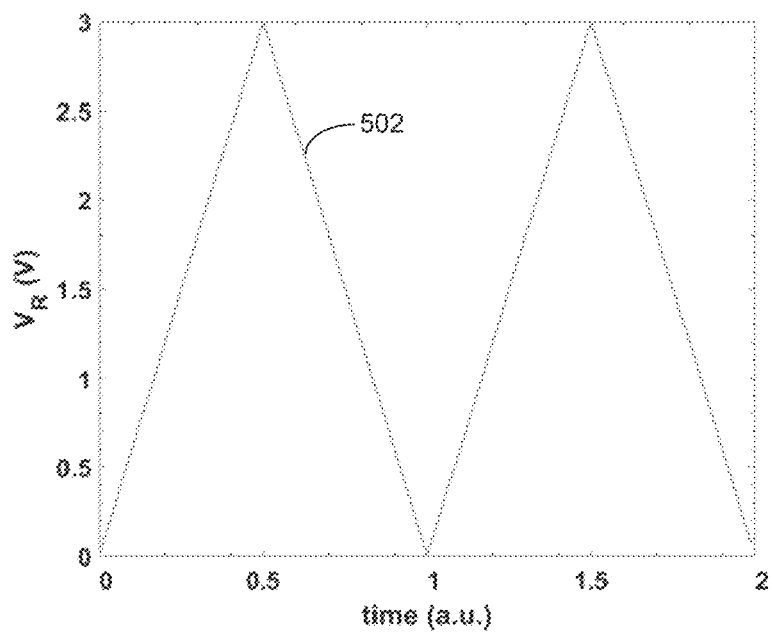
FIGS. 5-7 are graphs illustrating an example operation of the in-pixel driver circuit of FIGS. 1, 2, and/or 3.

FIG. 5 illustrates an example triangular wave 502 that may be emitted by the example column driver 114 as set forth in the flowchart of FIG. 4. The example triangular wave 502 has a period of approximately 12 microseconds.

Figure 6:
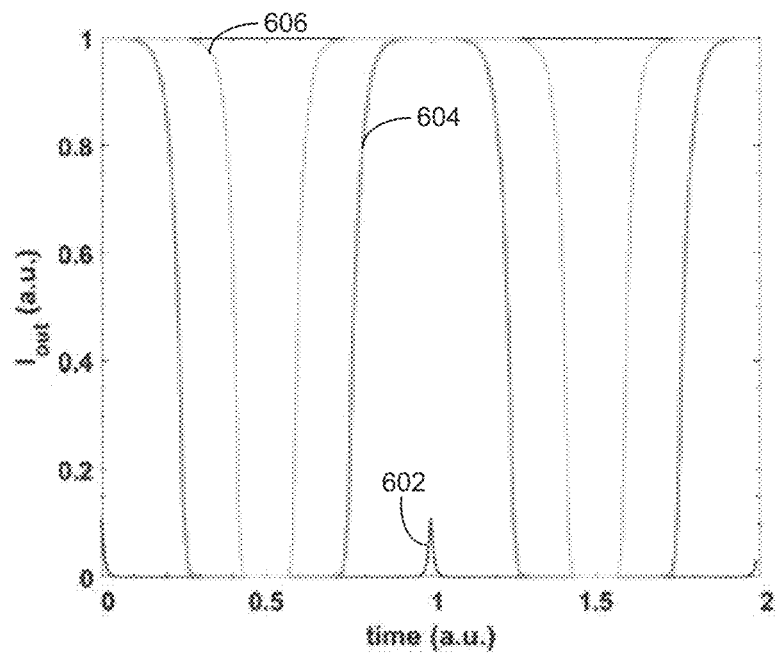

FIG. 6 illustrates example output PWM signals 602, 604, and 606 from the in-pixel driver circuit 108 of FIG. 3 when driven at the second input node 308 by the example triangular wave 502 of FIG. 5. The example first output PWM signal 602 is the output of the in-pixel driver circuit 108 when the data signal having DC voltage of 0V is supplied to the example first input node 306. The example first output PWM signal 602 generates a blue light emission from the example micro-LED 110. The example second output PWM signal 604 is the output of the in-pixel driver circuit 108 when the data signal having DC voltage of 1.5V is supplied to the example first input node 306. The example second output PWM signal 604 generates a red light emission from the example micro-LED 110. The example third output PWM signal 604 is the output of the in-pixel driver circuit 108 when the data signal having DC voltage of 3V is supplied to the example first input node 306. The example third output PWM signal 606 generates an orange light emission from the example micro-LED 110.

Thus, as illustrated in FIG. 6, the amplitude of the PWM signals remains constant, but the pulse width is varied based on the amplitude of the input data signal.

Figure 7:
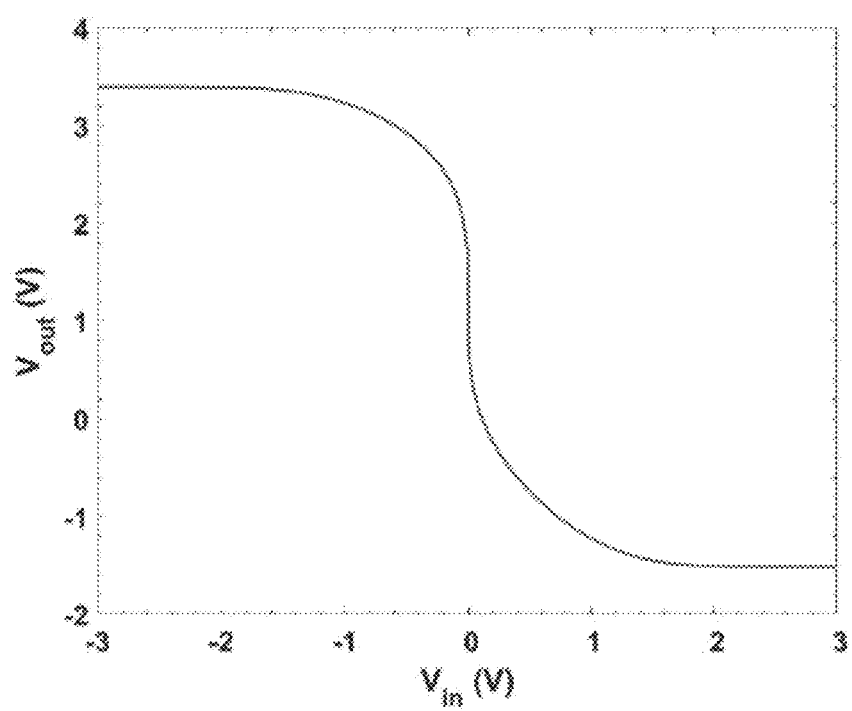

FIG. 7 illustrates an example transfer characteristic for the example in-pixel driver circuit 108 of FIG. 3. As shown in FIG. 3, an ultrahigh gain and ultralow offset are obtained to make an effective comparator circuit. The operational characteristics combined with the small circuit area enabled by the low transistor count and TFT architecture make the example in-pixel driver circuit 108 of FIG. 3 and other circuits implemented using the same principles well-suited for use in small displays such as those utilized in laptops, smartphones, etc.

Figure 8:
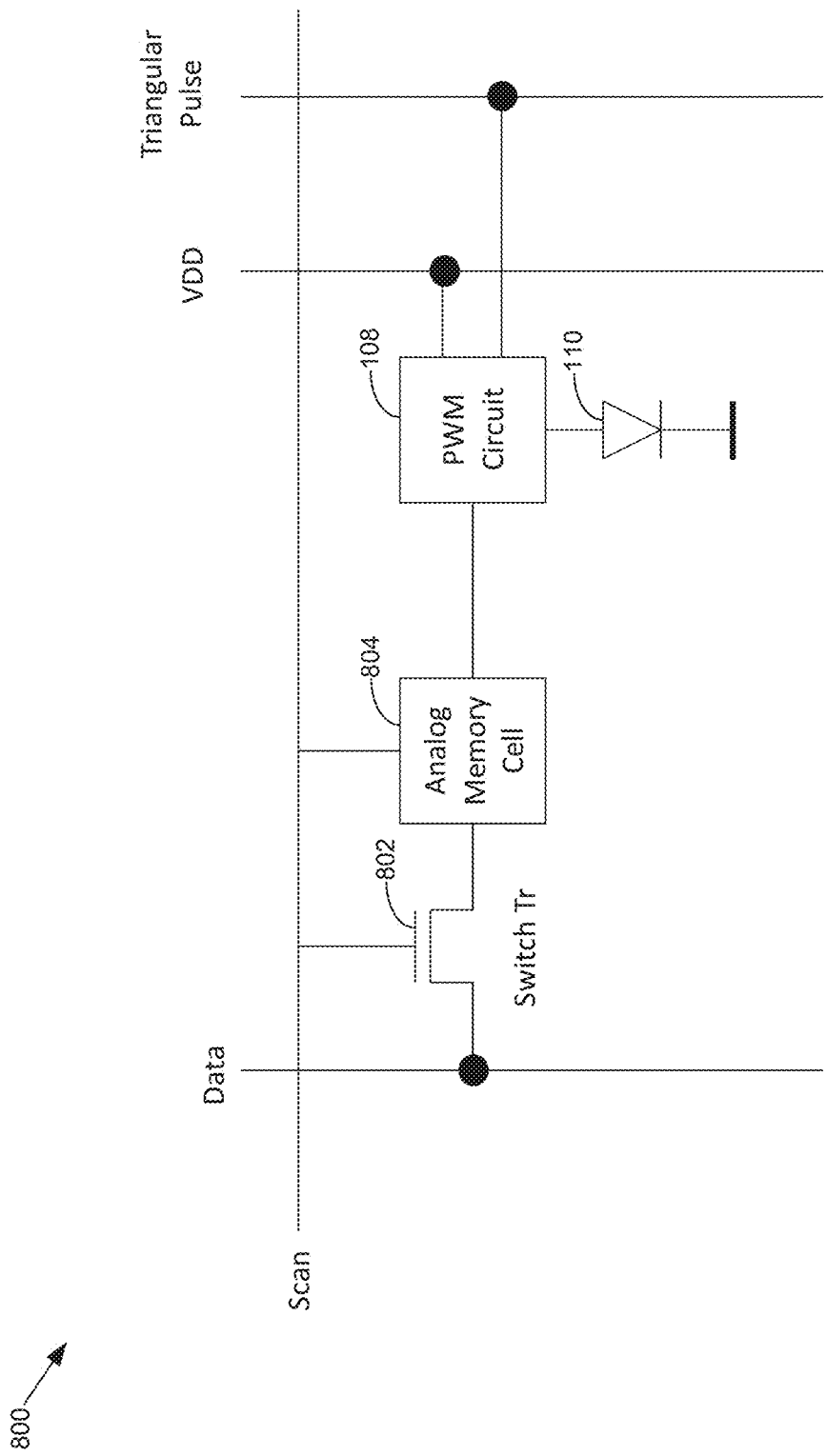
FIGS. 8-13 are block diagrams of example environments in which the in-pixel driver circuits of FIGS. 1-3 and/or 14-16 may operate to drive a micro-LED(s).

FIG. 8 is a block diagram of another example implementation of the in-pixel driver circuits 108 to drive the example micro-LEDs 110. Like the example circuit 200 illustrated in FIG. 2, an example circuit 800 of FIG. 8 includes the example in-pixel driver circuit 108, the example micro-LED 110, and an example switching transistor 802. The corresponding component characteristics and driving logic from the circuit 200 of FIG. 2 applies to the circuit 800 of FIG. 8 and is, thus, not repeated. The example circuit 800 further includes an example analog memory cell 804 to maintain a data output to the in-pixel driver circuit 108 without the need to refresh the driving signal when the image to be displayed is static. The emit rate of the example circuit 800 is equal to the scan rate applied.

Figure 9:
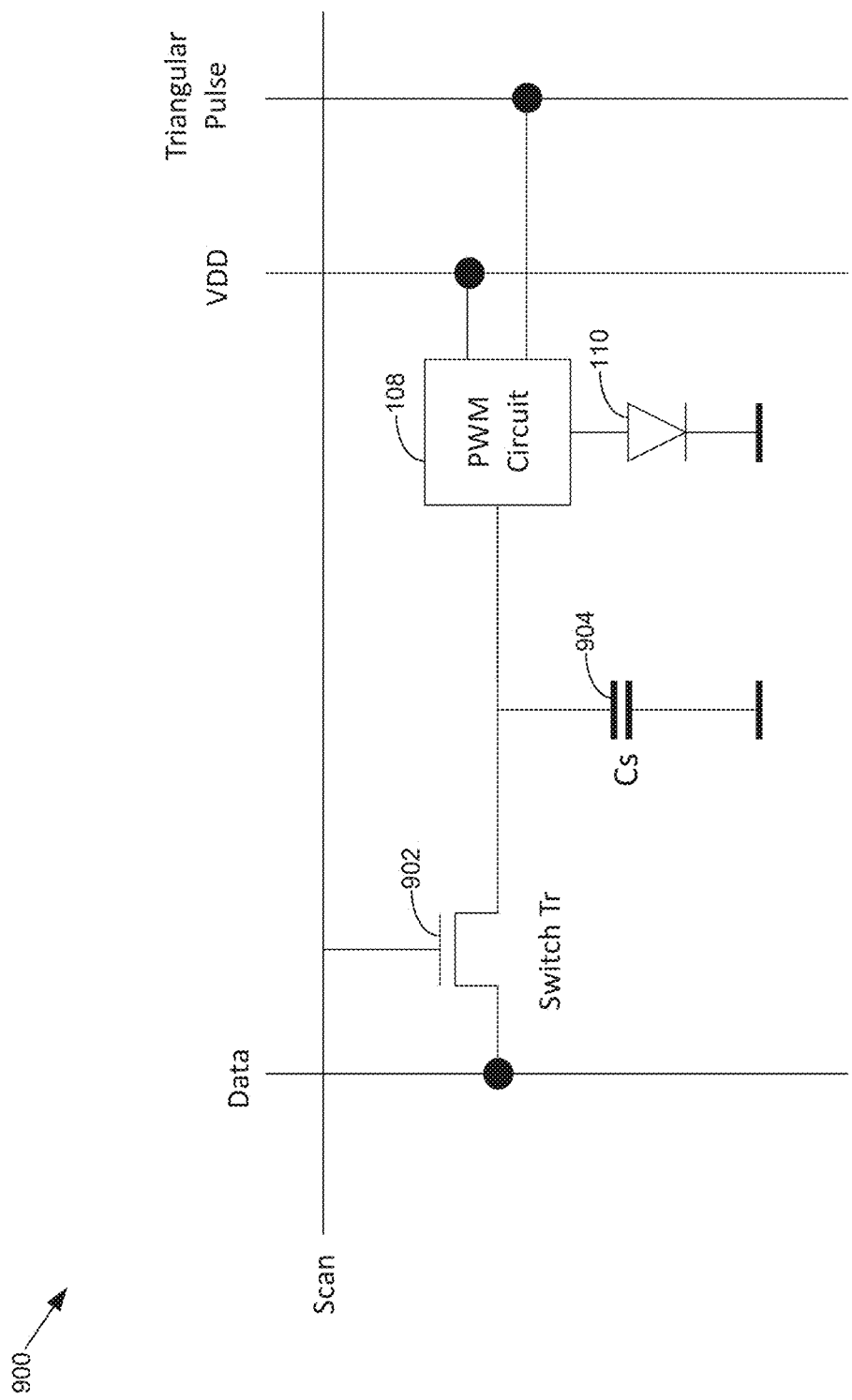

FIG. 9 is a block diagram of another example implementation of the in-pixel driver circuits 108 to drive the example micro-LEDs 110. Like the example circuit 200 illustrated in FIG. 2, an example circuit 900 of FIG. 9 includes the example in-pixel driver circuit 108, the example micro-LED 110, and an example switching transistor 902. The corresponding component characteristics and driving logic from the circuit 200 of FIG. 2 applies to the circuit 900 of FIG. 9 and is, thus, not repeated. The example circuit 900 further includes an example capacitor 904 to maintain a DC voltage data output to the in-pixel driver circuit 108 without the need to refresh the driving signal when the image to be displayed is static. The emit rate of the example circuit 900 is equal to the scan rate applied.

Figure 10:
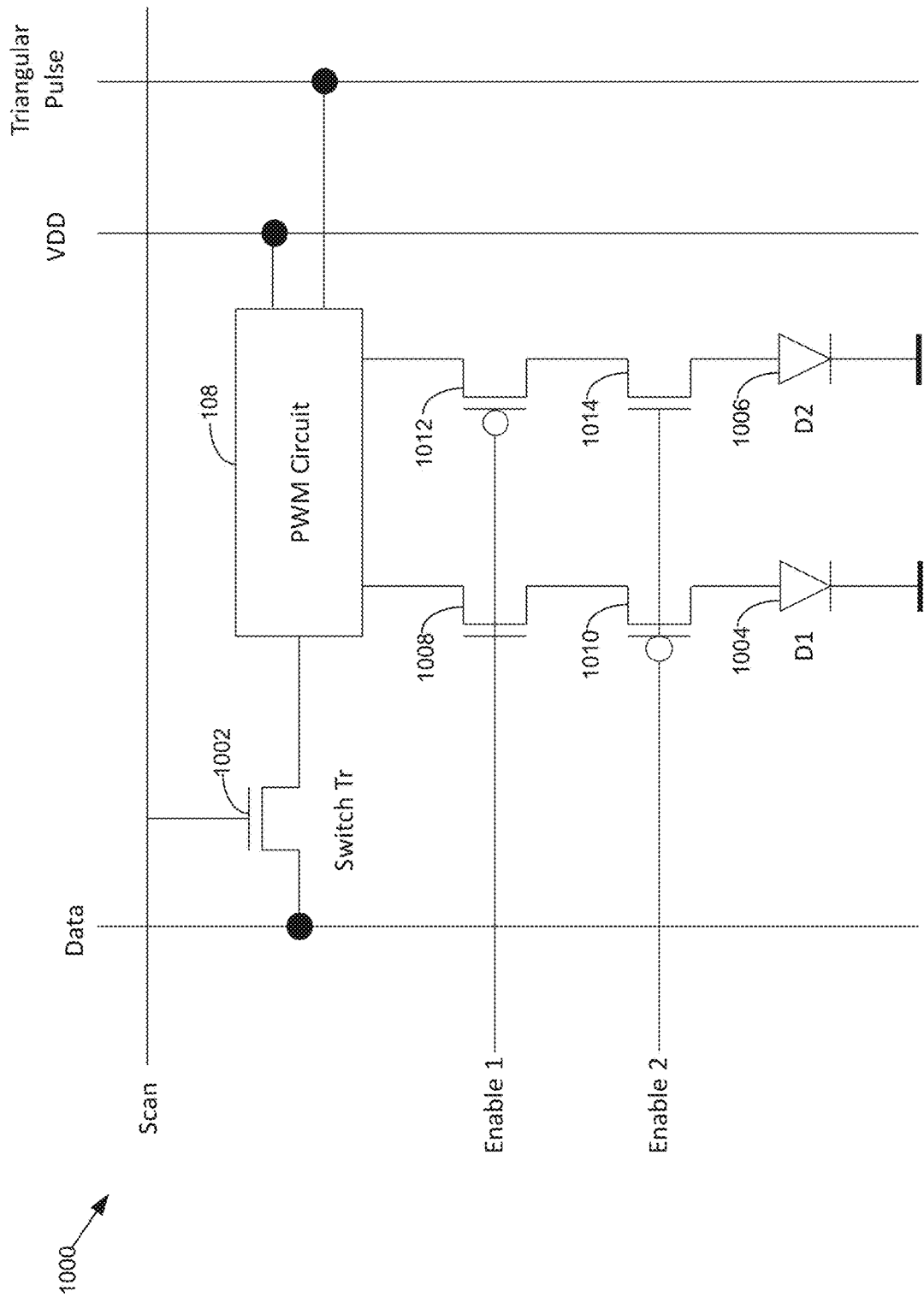

FIG. 10 is a block diagram of another example implementation of the in-pixel driver circuits 108 to drive the example micro-LEDs 110. Like the example circuit 200 illustrated in FIG. 2, an example circuit 1000 of FIG. 10 includes the example in-pixel driver circuit 108 and an example switching transistor 1002. The corresponding component characteristics and driving logic from the circuit 200 of FIG. 2 applies to the circuit 1000 of FIG. 10 and is, thus, not repeated. However, the circuit 1000 of FIG. 10 includes two micro-LEDs 110 that are the same color for redundancy: a first micro-LED 1004 and a second micro-LED 1006. The example circuit 1000 further includes transistors 1008-1014. When the transistors 1008, 1010 coupled to the first micro-LED 1004 are enabled (e.g., Enable 1 is high and Enable 2 is low), the first micro-LED 1004 is driven and the second micro-LED 1006 is not driven. When the transistors 1012, 1014 coupled to the second micro-LED 1006 are enabled (e.g., Enable 1 is low and Enable 2 is high), the second micro-LED 1006 is driven and the first micro-LED 1004 is not driven. According to the illustrated example, the in-pixel driver circuit 108 utilizes an emit rate that two times the scan rate to reduce flicker. For example, during each scan of a row, Enable 1 and Enable 2 will be sequentially enabled to illuminate the first micro-LED 1004 and then the second micro-LED 1006 (e.g., both micro-LEDs will be illuminated one at a time during each scan).

Figure 11:
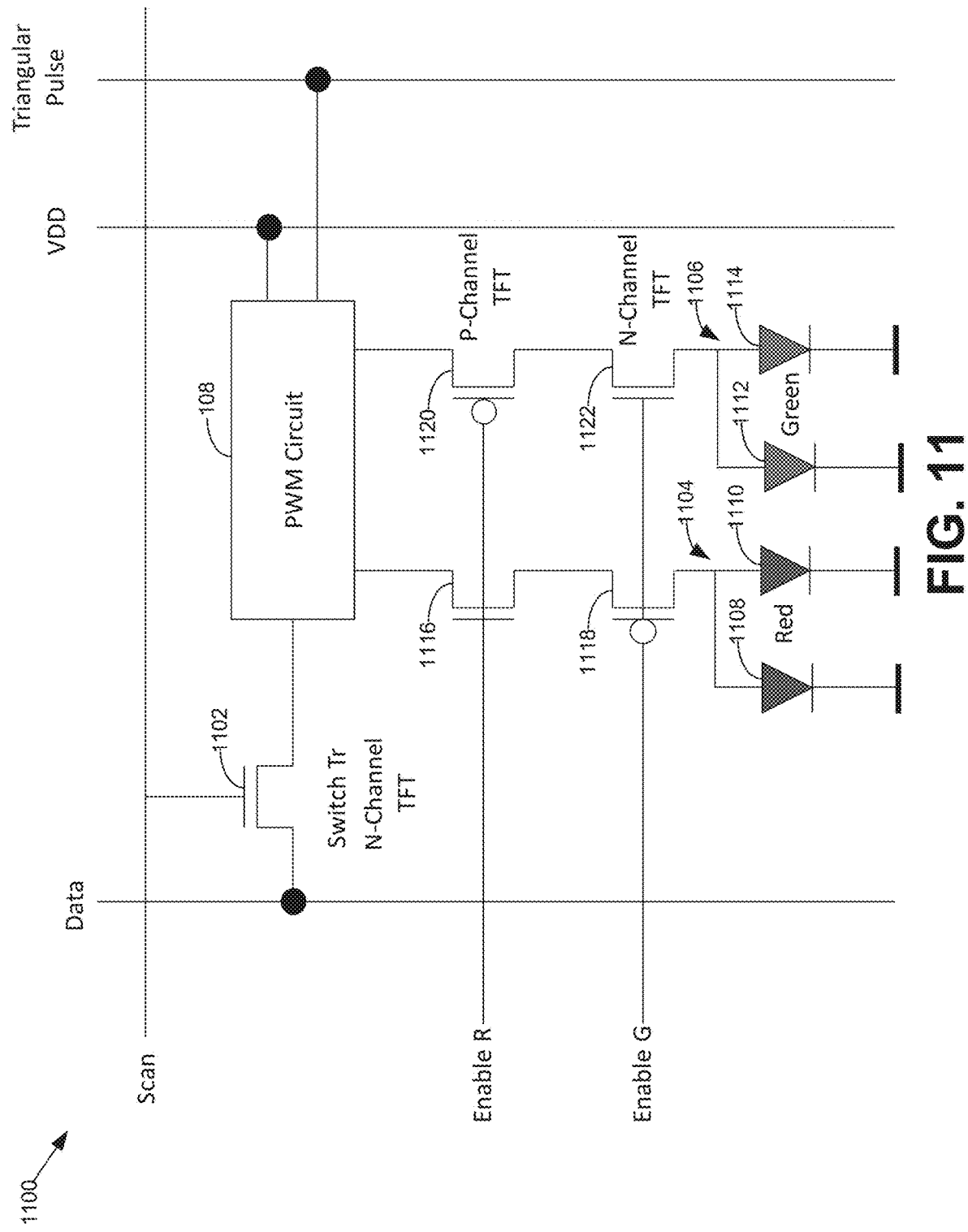

FIG. 11 is a block diagram of another example implementation of the in-pixel driver circuits 108 to drive the example micro-LEDs 110. Like the example circuit 200 illustrated in FIG. 2, an example circuit 1100 of FIG. 11 includes the example in-pixel driver circuit 108 and an example switching transistor 1102. The corresponding component characteristics and driving logic from the circuit 200 of FIG. 2 applies to the circuit 1100 of FIG. 11 and is, thus, not repeated. However, the circuit 1100 of FIG. 11 includes two sets of micro-LEDs 110: a set of first micro-LED 1104 and a second set of micro-LEDs 1006. The first set of micro-LEDs 1104 includes two micro-LEDs 1108, 1110 that are the same color (e.g., red) and provide redundancy. The second set of micro-LEDs 1106 includes two micro-LEDs 1112, 1114 that are the same color (e.g., green) and provide redundancy. The example circuit 1000 further includes transistors 1116-1122. When the transistors 1116, 1118 coupled to the first set of micro-LEDs 1108 are enabled (e.g., Enable R is high and Enable G is low), the first set of micro-LEDs 1104 is driven and the second set of micro-LEDs 1106 is not driven. When the transistors 1120, 1122 coupled to the set of second micro-LEDs 1106 are enabled (e.g., Enable 1 is low and Enable 2 is high), the second set of micro-LEDs 1106 is driven and the first set of micro-LEDs 1104 is not driven. Thus, the circuit 1100 allows for a single in-pixel driver circuit 108 to drive multiple different types (e.g., colors) of micro-LEDs 110. For example, the in-pixel driver circuit 108 may be utilized to sequentially drive the first set of micro-LEDs 1104 and then the second set of micro-LEDs 1106 by sequentially signaling on the Enable R and the Enable G signal lines. While the example circuit 1100 includes red and green micro-LEDs, any number of sets and number of micro-LEDs may be utilized (e.g., the circuit 1100 could include red, green, and blue micro-LEDs 110; red, green, blue, and white micro-LEDs 110, etc.). The emit rate of the example circuit 1100 is equal to the scan rate applied.

Figure 12:
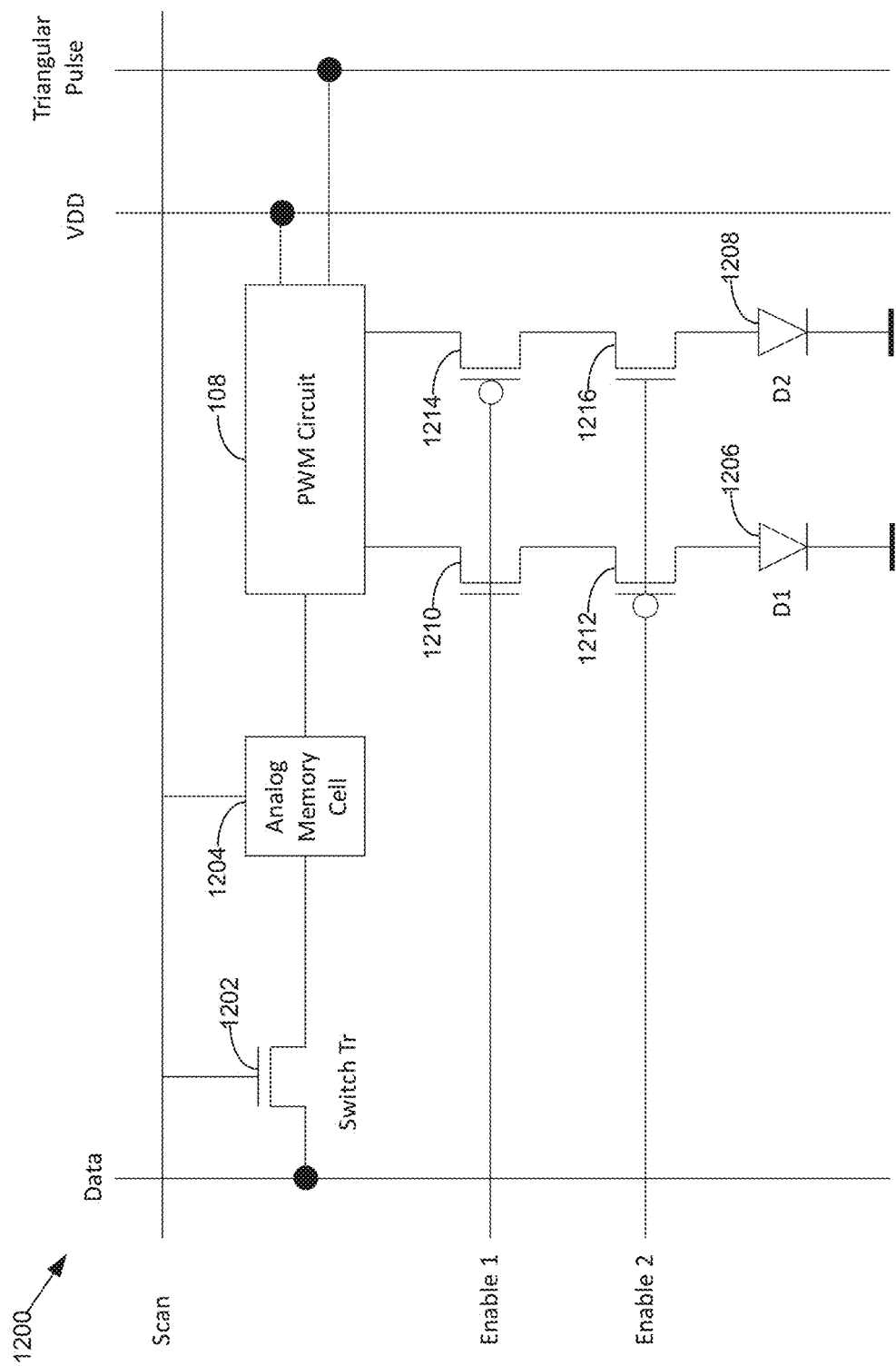

FIG. 12 is a block diagram of another example implementation of the in-pixel driver circuits 108 to drive the example micro-LEDs 110. Like the example circuit 200 illustrated in FIG. 2, an example circuit 1200 of FIG. 12 includes the example in-pixel driver circuit 108 and an example switching transistor 1202. The corresponding component characteristics and driving logic from the circuit 200 of FIG. 2 applies to the circuit 1200 of FIG. 12 and is, thus, not repeated. Like the example circuit 800, the example circuit 1200 also includes an analog memory cell 1204 to maintain a data signal for a static image. Like the circuit 1000 of FIG. 10, the circuit 1200 of FIG. 12 includes two micro-LEDs 110 that are the same color for redundancy: a first micro-LED 1206 and a second micro-LED 1208. The example circuit 1200 further includes transistors 1210-1216. When the transistors 1210, 1212 coupled to the first micro-LED 1206 are enabled (e.g., Enable 1 is high and Enable 2 is low), the first micro-LED 1206 is driven and the second micro-LED 1208 is not driven. When the transistors 1214, 1216 coupled to the second micro-LED 1208 are enabled (e.g., Enable 1 is low and Enable 2 is high), the second micro-LED 1208 is driven and the first micro-LED 1206 is not driven. According to the illustrated example, the in-pixel driver circuit 108 utilizes an emit rate that two times the scan rate to reduce flicker. For example, during each scan of a row, Enable 1 and Enable 2 will be sequentially enabled to illuminate the first micro-LED 1206 and then the second micro-LED 1208 (e.g., both micro-LEDs will be illuminated one at a time during each scan).

Figure 13:
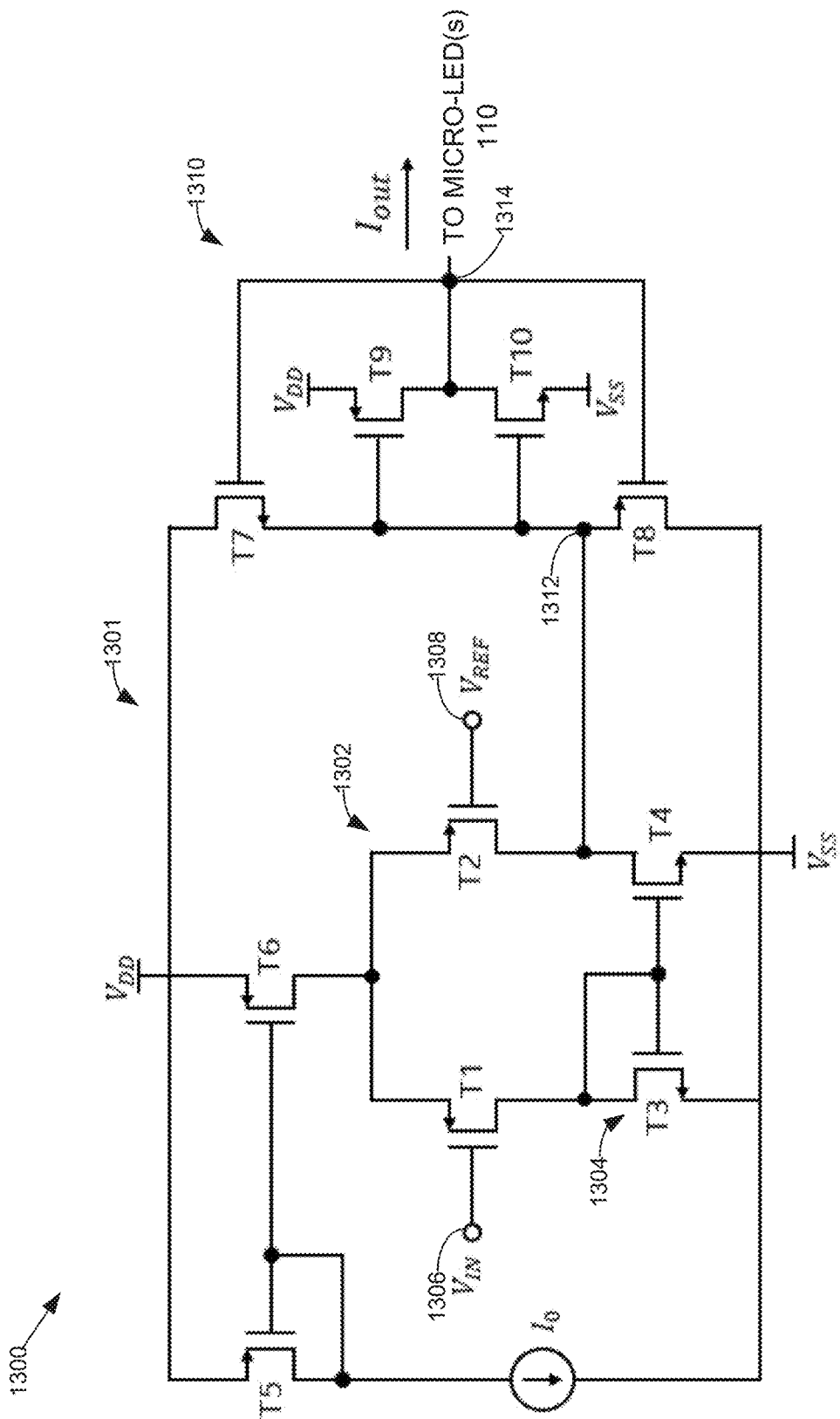

FIG. 13 illustrates another example circuit 1300 that may be utilized to implement the example in-pixel driver circuit 108 of FIGS. 1 and/or 2. The example circuit 1300 of FIG. 13 includes ten transistors as compared with the eight transistors utilized in the example circuit 300 of FIG. 3. The ten transistors of the circuit 1300 may be implemented using LTPS TFTs or LTPO TFTs.

According to the example of FIG. 13, an example transconductance stage 1301 includes an example differential amplifier 1302 implemented using p-channel TFTs and an example current mirror 1304 implemented suing n-channel TFTs. A data input is provided to a first input node 1306 and a reference signal (e.g., the triangular wave signal supplied by the column driver 114) is provided to the second input node 1308.

The circuit 1300 also includes an example transresistance stage 1310 that senses the current into a feedback node 1312 and generates an output voltage at an output node 1314 that indicates which of the first input voltage or the second input voltage has a greater magnitude. The output voltage at the output node 1314 is a PWM signal that is supplied to the micro-LED(s) 110. The voltage generated by the transconductance stage 1301 at the feedback node 1312 is clamped by the transresistance stage 1310.

Figure 14:
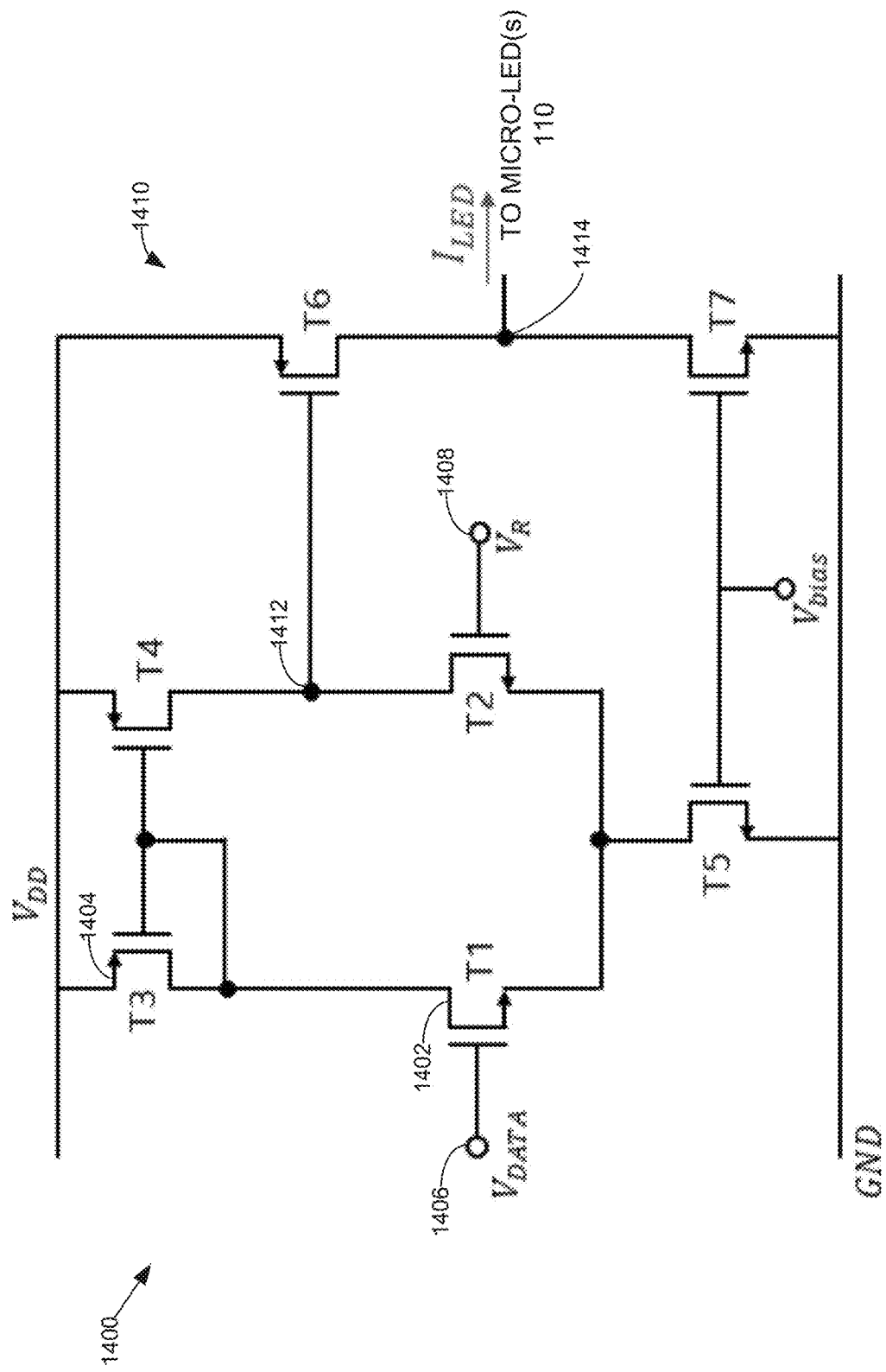

FIG. 14 illustrates another example circuit 1400 that may be utilized to implement the example in-pixel driver circuit 108 of FIGS. 1 and/or 2. The example circuit 1400 of FIG. 14 includes seven transistors as compared with the eight transistors utilized in the example circuit 300 of FIG. 3. The seven transistors of the circuit 1300 may be implemented using LTPS TFTs or LTPO TFTs.

According to the example of FIG. 14, an example transconductance stage 1401 includes an example differential amplifier 1402 implemented using n-channel TFTs and an example current mirror 1404 implemented suing p-channel TFTs. A data input is provided to a first input node 1406 and a reference signal (e.g., the triangular wave signal supplied by the column driver 114) is provided to the second input node 1408.

The circuit 1400 also includes an example transresistance stage 1410 that senses the current into a feedback node 1412 and generates an output voltage at an output node 1414 that indicates which of the first input voltage or the second input voltage has a greater magnitude. The output voltage at the output node 1414 is a PWM signal that is supplied to the micro-LED(s) 110. The voltage generated by the transconductance stage 1401 at the feedback node 1412 is clamped by the transresistance stage 1410.

Figure 15:
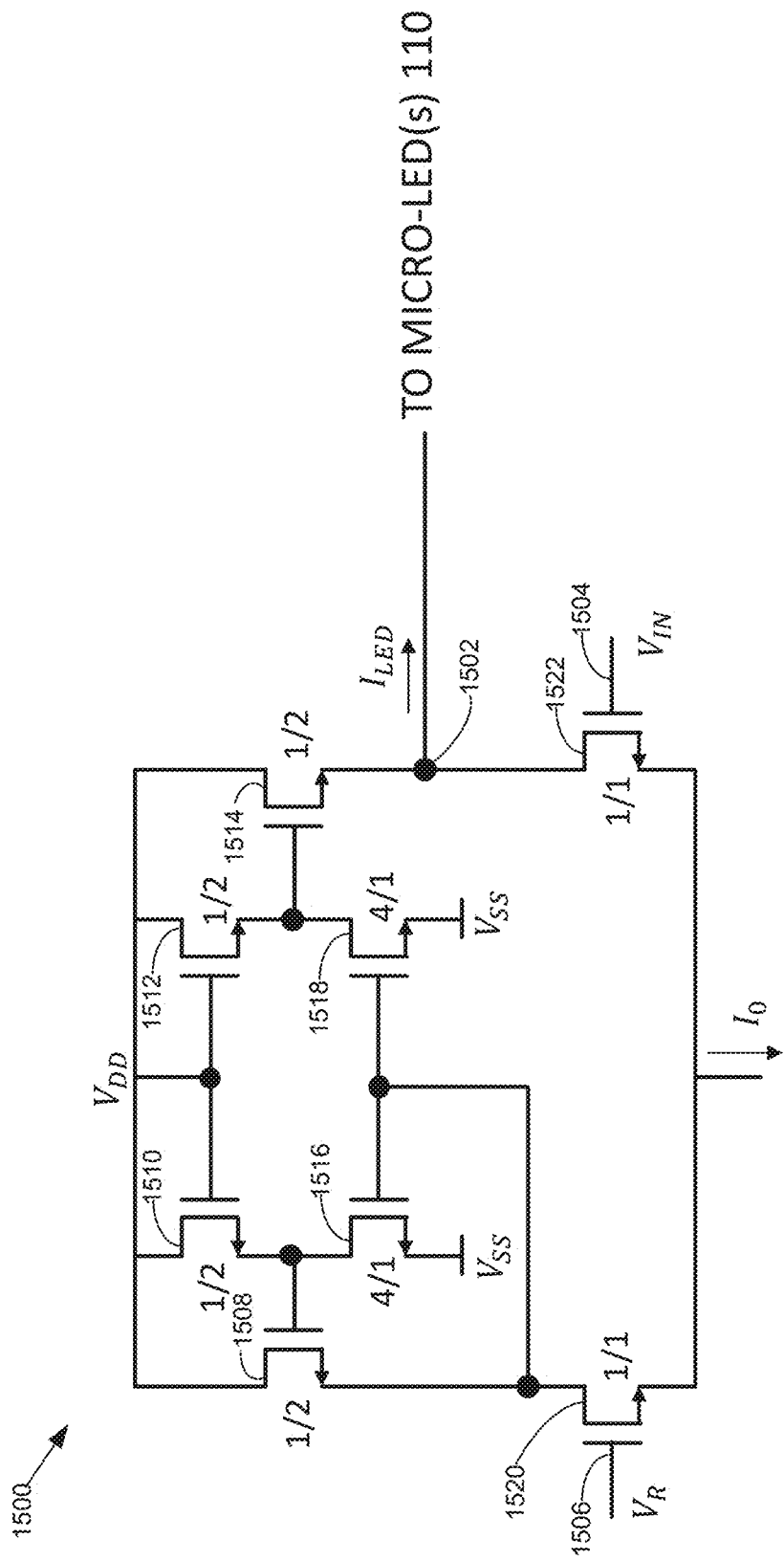

FIG. 15 illustrates another example circuit 1500 that may be utilized to implement the example in-pixel driver circuit 108 of FIGS. 1 and/or 2. Like the circuit 300 of FIG. 3, the example circuit 1500 of FIG. 15 includes eight transistors. The eight transistors of the circuit 1500 are n-channel transistors and may be implemented using LTPS TFTs or oxide semiconductor TFTs.

The example circuit 1500 utilizes a pseudo-CMOS design to generate a PWM output signal at the output node 1502 based on a first data input DC voltage signal provided to the example first input node 1504 and a reference signal (e.g., a triangular wave signal) supplied to the second input node 1506. According to the illustrated example, transistors 1508, 1510, 1512, and 1514 have a width that is twice a length of the transistor. According to the illustrated example, transistors 1516 and 1518 have a width that is four times their length. According to the illustrated example, transistors 1520 and 1522 have a width that is equal to their length.

Figure 16:
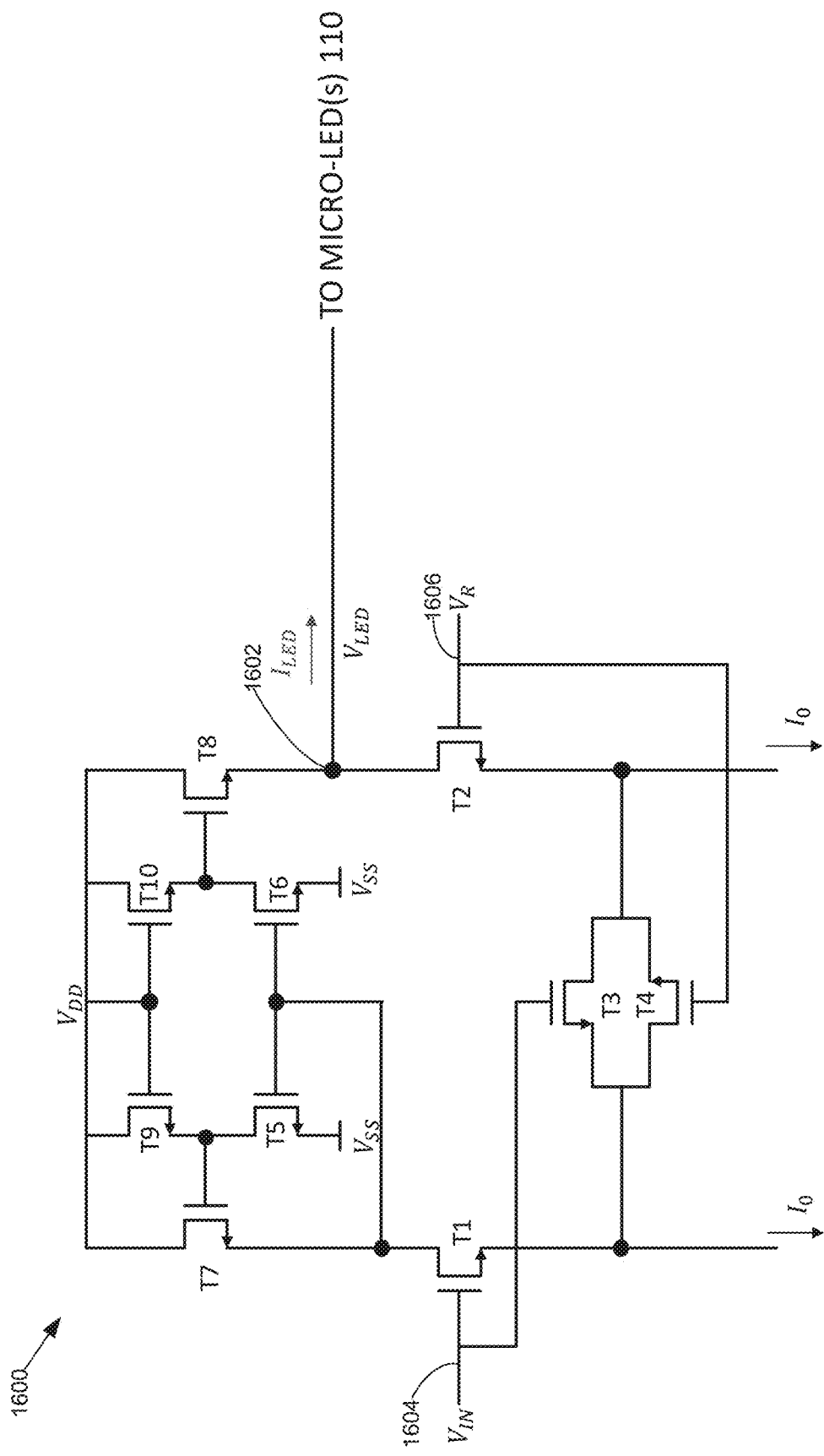

FIG. 16 illustrates another example circuit 1500 that may be utilized to implement the example in-pixel driver circuit 108 of FIGS. 1 and/or 2. The example circuit 1600 of FIG. 16 includes ten transistors as compared with the eight transistors included in the example circuit 300 of FIG. 3. The ten transistors of the circuit 1600 are n-channel transistors and may be implemented using LTPS TFTs or oxide semiconductor TFTs.

The example circuit 1600 utilizes a pseudo-CMOS design to generate a PWM output signal at the output node 1602 based on a first data input DC voltage signal provided to the example first input node 1604 and a reference signal (e.g., a triangular wave signal) supplied to the second input node 1606.

Figure 17:
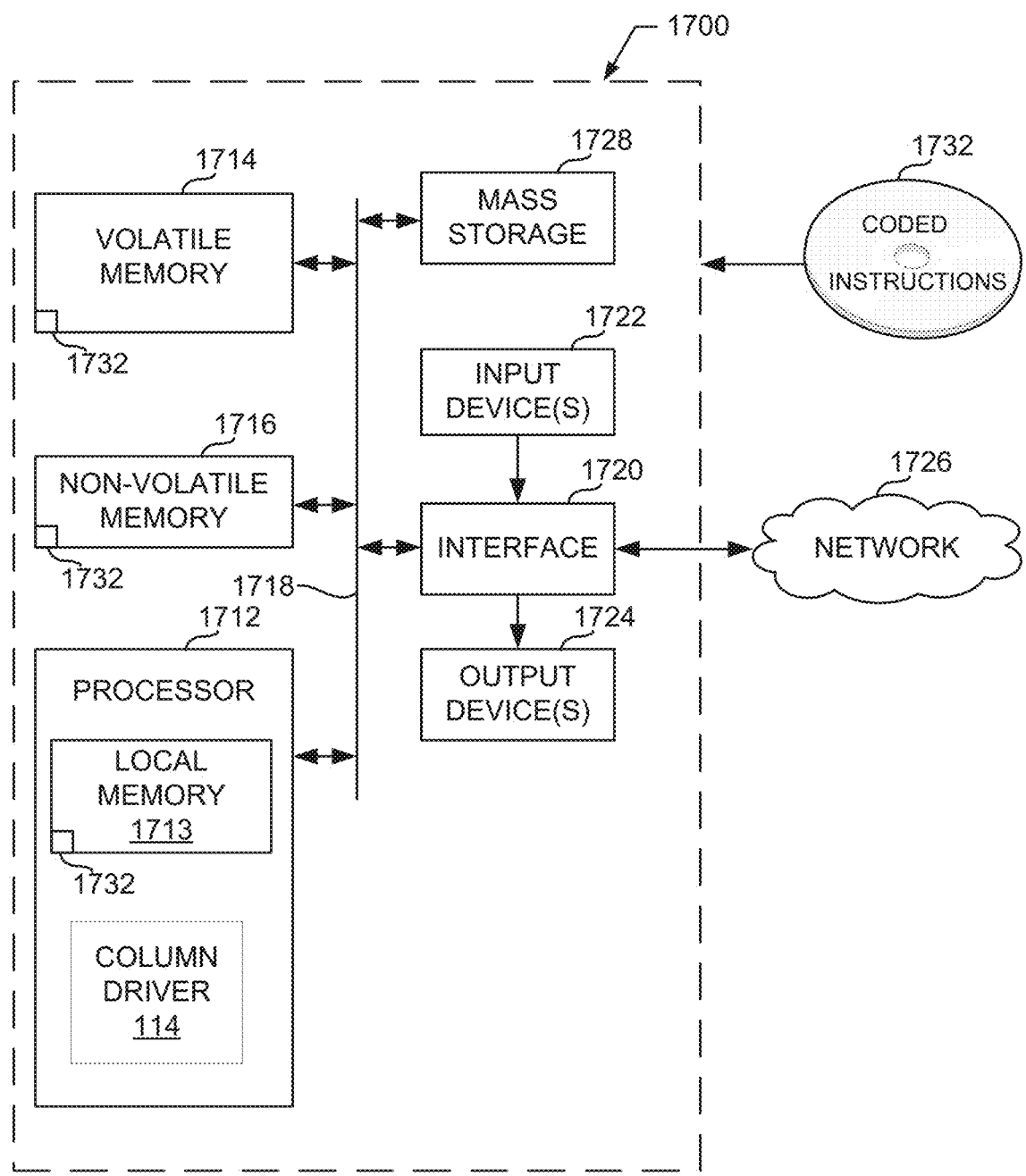
FIG. 17 is a block diagram of an example processor system that execute the instructions of FIG. 4 to implement the column driver of FIG. 1 to generate a driving reference signal.

FIG. 17 is a block diagram of an example processor platform 1700 structured to execute the instructions of FIG. 4 to implement and/or operate (e.g., the column driver 114 may be implemented in conjunction with a processing device and/or a controller implemented by and/or in-conjunction with the processor platform 1700) the column driver 114 of FIG. 1. The processor platform 1700 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, a headset or other wearable device, or any other type of computing device.

The processor platform 1700 of the illustrated example includes a processor 1712. The processor 1712 of the illustrated example is hardware. For example, the processor 1712 can be implemented by one or more integrated circuits, logic circuits, microprocessors, GPUs, DSPs, or controllers from any desired family or manufacturer. The hardware processor may be a semiconductor based (e.g., silicon based) device. In this example, the processor implements the column driver 114 by performing the instructions represented in FIG. 4.

The processor 1712 of the illustrated example includes a local memory 1713 (e.g., a cache). The processor 1712 of the illustrated example is in communication with a main memory including a volatile memory 1714 and a non-volatile memory 1716 via a bus 1718. The volatile memory 1714 may be implemented by Synchronous Dynamic Random Access Memory (SDRAM), Dynamic Random Access Memory (DRAM), RAMBUS® Dynamic Random Access Memory (RDRAM®) and/or any other type of random access memory device. The non-volatile memory 1716 may be implemented by flash memory and/or any other desired type of memory device. Access to the main memory 1714, 1716 is controlled by a memory controller.

The processor platform 1700 of the illustrated example also includes an interface circuit 1720. The interface circuit 1720 may be implemented by any type of interface standard, such as an Ethernet interface, a universal serial bus (USB), a Bluetooth® interface, a near field communication (NFC) interface, and/or a PCI express interface.

In the illustrated example, one or more input devices 1722 are connected to the interface circuit 1720. The input device(s) 1722 permit(s) a user to enter data and/or commands into the processor 1712. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 1724 are also connected to the interface circuit 1720 of the illustrated example. The output devices 1724 can be implemented, for example, by display devices (e.g., a light-emitting diode (LED), an organic light-emitting diode (OLED), a liquid crystal display (LCD), a cathode ray tube display (CRT), an in-place switching (IPS) display, a touchscreen, etc.), a tactile output device, a printer and/or speaker. The interface circuit 1720 of the illustrated example, thus, typically includes a graphics driver card, a graphics driver chip and/or a graphics driver processor.

The interface circuit 1720 of the illustrated example also includes a communication device such as a transmitter, a receiver, a transceiver, a modem, a residential gateway, a wireless access point, and/or a network interface to facilitate exchange of data with external machines (e.g., computing devices of any kind) via a network 1726. The communication can be via, for example, an Ethernet connection, a digital subscriber line (DSL) connection, a telephone line connection, a coaxial cable system, a satellite system, a line-of-sight wireless system, a cellular telephone system, etc.

The processor platform 1700 of the illustrated example also includes one or more mass storage devices 1728 for storing software and/or data. Examples of such mass storage devices 1728 include floppy disk drives, hard drive disks, compact disk drives, Blu-ray disk drives, redundant array of independent disks (RAID) systems, and digital versatile disk (DVD) drives.

The machine executable instructions 1732 of FIG. 4 may be stored in the mass storage device 1728, in the volatile memory 1714, in the non-volatile memory 1716, and/or on a removable non-transitory computer readable storage medium such as a CD or DVD.

From the foregoing, it will be appreciated that example methods, apparatus and articles of manufacture have been disclosed that implement in-pixel driving of micro-LEDs using PWM signals. In some examples, the in-pixel driving circuits described herein may be less than or equal to 100 micrometers by 100 micrometers and may be less than or equal to 30 micrometers by 30 micrometers through the use of fewer transistors than prior art circuits and through the use of technologies such as TFT and LTPO. The disclosed methods, apparatus and articles of manufacture facilitate the use of a low frequency reference signal (e.g., a sawtooth wave signal, a triangular wave signal, etc.) that is converted to a PWM driving signal by the example disclosed in-pixel driver circuits. According to some examples, the in-pixel driver circuit to output the PWM signal may be implemented using TFT technology. According to some examples, the in-pixel driver circuit to output the PWM signal may be implemented using LTPO technology. Such implementations facilitate the implementation of in-pixel driver circuits that are sufficiently small to be utilized in a variety of device sizes including laptops, smartphones, handheld device, wearable devices (e.g., smart watches), etc.

Example methods, apparatus, systems, and articles of manufacture for in-pixel driving of micro-LED circuits are disclosed herein. Further examples and combinations thereof include the following:

Example 1 includes a light-emitting diode driver comprising a first input node to receive a data signal, a second input node to receive a reference signal having a first frequency, and a driver circuit including thin-film transistors to output a current pulse for driving a light-emitting diode, the current pulse having a width based on the data signal and the reference signal, the output signal having a second frequency that is greater than the first frequency.

Example 2 includes the light-emitting diode driver of example 1, wherein the current pulse width modulated (PWM) signal.

Example 3 includes the light-emitting diode driver of example 1, wherein the driver circuit includes a transconductance stage and a transresistance stage.

Example 4 includes the light-emitting diode driver of example 3, wherein the transconductance stage includes a differential pair and a current mirror.

Example 5 includes the light-emitting diode driver of example 4, further including a current mirror coupled between a supply voltage and the differential pair.

Example 6 includes the light-emitting diode driver of example 4, wherein the differential pair includes two n-channel transistors and the current mirror includes two p-channel transistors.

Example 7 includes the light-emitting diode driver of example 6, wherein the n-channel transistors are at least one of low temperature polysilicon, indium phosphide (InP), gallium phosphide (GaP), gallium nitride (GaN), or indium gallium zinc oxide (IGZO) thin-film transistors.

Example 8 includes the light-emitting diode driver of example 6, wherein the p-channel transistors are at least one of low temperature polysilicon, indium phosphide (InP), gallium phosphide (GaP), or gallium nitride (GaN). example 9 includes the light-emitting diode driver of example 1, wherein the data signal is a direct current (DC) voltage signal.

Example 10 includes the light-emitting diode driver of example 1, wherein the reference signal is one of a triangular wave signal or a sawtooth wave signal.

Example 11 includes the light-emitting diode driver of example 1, wherein the thin-film transistors are low-temperature polycrystalline or oxide thin-film transistors.

Example 12 includes the light-emitting diode driver of example 1, wherein the light-emitting diode is a micro-light-emitting diode.

Example 13 includes the light-emitting diode driver of example 1, wherein the driver circuit is to compare a first voltage of the data signal to a second voltage of the reference signal.

Example 14 includes a micro-light-emitting diode (micro-LED) display comprising a plurality of pixels arranged in a two-dimensional matrix, the pixels each including a micro-LED, and a drive circuit to drive the light-emission section, the drive circuit including an in-pixel pulse-width modulation (PWM) unit configured to receive an electric potential based on an image signal voltage and one of a sawtooth or triangular pulse, and output a predetermined current pulse based on a comparison of the electrical potential and the one of the sawtooth or triangular pulse.

Example 15 includes the micro-LED display of example 14, further including a plurality of micro-LEDs coupled to the drive circuit for each pixel.

Example 16 includes the micro-LED display of example 14, wherein the drive circuit includes a switching transistor coupled between the electric potential based on an image signal voltage and the in-pixel PWM unit.

Example 17 includes the micro-light-emitting diode (micro-LED) display of example 16, wherein the drive circuit includes a memory cell coupled between the switching transistor and the in-pixel PWM unit, the memory cell to store the electric potential based on the image signal for supplying the electric potential based on the image signal to the in-pixel PWM unit to generate a static image until the electric potential based on the image signal is refreshed.

Example 18 includes the micro-LED display of example 16, further including a capacitor coupled to the connection between the switching transistor and the in-pixel PWM unit, the capacitor to store the electric potential based on the image signal for supplying the electric potential based on the image signal to the in-pixel PWM unit to generate a static image until the electric potential based on the image signal is refreshed example 19 includes the micro-LED display of example 16, wherein the micro-LED is a first micro-LED and each pixel further includes a second micro-LED, a first switching transistor coupled to the output of the in-pixel PWM unit, a second switching transistor, and a first enable signal, the second switching transistor further coupled to the first micro-LED and a second enable signal, wherein the second switching transistor inverts the second enable signal, a third switching transistor coupled to the output of the in-pixel PWM unit, a fourth switching transistor, and the first enable signal, and the fourth switching transistor further coupled to the second micro-LED and the second enable signal, wherein the fourth switching transistor inverts the second enable signal.

Example 20 includes the micro-LED display of example 16, wherein each pixel further includes a third micro-LED coupled to the second switching transistor in parallel with the first micro-LED, and a fourth micro-LED coupled to the fourth switching transistor in parallel with the second micro-LED, wherein the first micro-LED and the third micro-LED illuminate with a first color and the second micro-LED and the fourth micro-LED illuminate with a second color different than the first color.

Example 21 includes the micro-LED display of example 16, wherein the drive circuit includes a memory cell coupled between the switching transistor and the in-pixel PWM unit, the memory cell to store the electric potential based on the image signal for supplying the electric potential based on the image signal to the in-pixel PWM unit to generate a static image until the electric potential based on the image signal is refreshed.

Example 22 includes a light-emitting diode display comprising a first light-emitting diode, a first light-emitting diode driver including a first input node to receive a first data signal, a second input node to receive a reference signal having a first frequency, and first driver circuit including thin-film transistors to output a first current pulse for driving a light-emitting diode, the first current pulse having a width based on the first data signal and the reference signal, the first output signal having a second frequency that is greater than the first frequency, a second light-emitting diode, a second light-emitting diode driver including a third input node to receive a second data signal, a third input node to receive a reference signal having the first frequency, and a second driver circuit including thin-film transistors to output a second current pulse for driving a light-emitting diode, the second current pulse having a width based on the second data signal and the reference signal, the second output signal having a third frequency that is greater than the first frequency.

Example 23 includes the light-emitting diode display of example 22, wherein the first light-emitting diode and the second light-emitting diode are arranged in a first column of the light-emitting diode display and wherein the first light-emitting diode is arranged in a first row of the light-emitting diode display with a third light-emitting diode and the second light-emitting diode is are arranged in a second row of the light-emitting diode display with a fourth light-emitting diode.

Example 24 includes the light-emitting diode display of example 22, wherein the first light emitting diode and the second light emitting diode have at least one of a length or a width that is less than 100 micrometers.

Example 26 includes the light-emitting diode display of example 22, wherein the thin-film transistors are low-temperature polycrystalline or oxide thin-film transistors.

As used herein, a node may be any type of connection point element such as a pin, a port, a pad, a through-hole, a terminal, a coupling, a leg, a wire, a solder-point, etc.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

The following claims are hereby incorporated into this Detailed Description by this reference, with each claim standing on its own as a separate embodiment of the present disclosure.

What is claimed is:

1. A light-emitting diode driver comprising:
a first input node to receive a data signal;
a second input node to receive a reference signal having a first frequency; and
a driver circuit including thin-film transistors to output a current pulse for driving a light-emitting diode, the current pulse having a width based on the data signal and the reference signal, the output signal having a second frequency that is greater than the first frequency;
a first switching transistor coupled between an electric potential based on an image signal voltage and an in-pixel PWM unit;
a second switching transistor coupled to an output of the in-pixel PWM unit, a third switching transistor, and a first enable signal;
the third switching transistor further coupled to a first micro-LED and a second enable signal, wherein the third switching transistor inverts the second enable signal;
a fourth switching transistor coupled to the output of the in-pixel PWM unit, a fifth switching transistor, and the first enable signal; and the fifth switching transistor further coupled to a second micro-LED and the second enable signal, wherein the fifth switching transistor inverts the second enable signal.

2. The light-emitting diode driver of claim 1, wherein the current is a pulse width modulated (PWM) signal.

3. The light-emitting diode driver of claim 1, wherein the driver circuit includes a transconductance stage and a transresistance stage.

4. The light-emitting diode driver of claim 3, wherein the transconductance stage includes a differential pair and a current mirror.

5. The light-emitting diode driver of claim 4, further including a current mirror coupled between a supply voltage and the differential pair.

6. The light-emitting diode driver of claim 4, wherein the differential pair includes two n-channel transistors and the current mirror includes two p-channel transistors.

7. The light-emitting diode driver of claim 6, wherein the n-channel transistors are at least one of low temperature polysilicon, indium phosphide (InP), gallium phosphide (GaP), gallium nitride (GaN), or indium gallium zinc oxide (IGZO) thin-film transistors.

8. The light-emitting diode driver of claim 6, wherein the p-channel transistors are at least one of low temperature polysilicon, indium phosphide (InP), gallium phosphide (GaP), or gallium nitride (GaN).

9. The light-emitting diode driver of claim 1, wherein the data signal is a direct current (DC) voltage signal.

10. The light-emitting diode driver of claim 1, wherein the reference signal is one of a triangular wave signal or a sawtooth wave signal.

11. The light-emitting diode driver of claim 1, wherein the thin-film transistor is a low-temperature polycrystalline or oxide thin-film transistor.

12. The light-emitting diode driver of claim 1, wherein the light-emitting diode is a micro-light-emitting diode.

13. The light-emitting diode driver of claim 1, wherein the driver circuit is to compare a first voltage of the data signal to a second voltage of the reference signal.

14. A micro-light-emitting diode (micro-LED) display comprising:
a plurality of pixels arranged in a two-dimensional matrix, the pixels each including:
a first micro-LED;
a second micro-LED; and
a drive circuit for each pixel of a plurality of pixels to drive a light-emission section, the drive circuit including:
an in-pixel pulse-width modulation (PWM) unit configured to:
receive an electric potential based on an image signal voltage and one of a sawtooth or triangular pulse, and
output a predetermined current pulse based on a comparison of the electrical potential and the one of the sawtooth or triangular pulse;
a first switching transistor coupled between the electric potential based on an image signal voltage and the in-pixel PWM unit;
a second switching transistor coupled to the output of the in-pixel PWM unit, a third switching transistor, and a first enable signal;
the third switching transistor further coupled to the first micro-LED and a second enable signal, wherein the third switching transistor inverts the second enable signal;

a fourth switching transistor coupled to the output of the in-pixel PWM unit, a fifth switching transistor, and the first enable signal; and
the fifth switching transistor further coupled to the second micro-LED and the second enable signal, wherein the fifth switching transistor inverts the second enable signal.

15. The micro-LED display of claim 14, further including a plurality of micro-LEDs coupled to the drive circuit for each pixel.

16. The micro-light-emitting diode (micro-LED) display of claim 15, wherein the drive circuit includes a memory cell coupled between the first switching transistor and the in-pixel PWM unit, the memory cell to store the electric potential based on the image signal for supplying the electric potential based on the image signal to the in-pixel PWM unit to generate a static image until the electric potential based on the image signal is refreshed.

17. The micro-LED display of claim 15, further including a capacitor coupled to a connection between the first switching transistor and the in-pixel PWM unit, the capacitor to store the electric potential based on the image signal for supplying the electric potential based on the image signal to the in-pixel PWM unit to generate a static image until the electric potential based on the image signal is refreshed.

18. The micro-LED display of claim 14, wherein each pixel further includes:
a third micro-LED coupled to the second switching transistor in parallel with the first micro-LED; and
a fourth micro-LED coupled to the fourth switching transistor in parallel with the second micro-LED,
wherein the first micro-LED and the third micro-LED illuminate with a first color and the second micro-LED and the fourth micro-LED illuminate with a second color different than the first color.

19. A light-emitting diode display comprising:
a first light-emitting diode;
a first light-emitting diode driver including:
a first input node to receive a first data signal;
a second input node to receive a reference signal having a first frequency; and
a first driver circuit for a first pixel of a plurality of pixels including a thin- film transistor for the first pixel to output a first current pulse for driving a light-emitting diode, the first current pulse having a width based on the first data signal and the reference signal, the first output having a second frequency that is greater than the first frequency;
a second light-emitting diode;
a second light-emitting diode driver including:
a third input node to receive a second data signal;
a third input node to receive a reference signal having the first frequency; and
a second driver circuit for a second pixel of the plurality of pixels including:
a second column driver for the second pixel;
a second row driver for the second pixel to supply a second scan signal;
a thin-film transistor for the second pixel to output a second current pulse for driving a light-emitting diode, the second current pulse having a width based on the second data signal and the reference signal, the second output having a third frequency that is greater than the first frequency; and
a third light-emitting diode coupled to a first switching transistor in parallel with the first light-emitting diode and a fourth light-emitting diode coupled to a second switching transistor in parallel with the second light-emitting diode, wherein the first light-emitting diode and the third light-emitting diode illuminate with a first color and the second light-emitting diode and the fourth light-emitting diode illuminate with a second color different than the first color.

20. The light-emitting diode display of claim 19, wherein the first light-emitting diode and the second light-emitting diode are arranged in a first column of the light-emitting diode display and wherein the first light-emitting diode is arranged in a first row of the light-emitting diode display with the third light-emitting diode and the second light-emitting diode is are arranged in a second row of the light-emitting diode display with the fourth light-emitting diode.

21. The light-emitting diode display of claim 19, wherein the first light emitting diode and the second light emitting diode have at least one of a length or a width that is less than 100 micrometers.

22. The light-emitting diode display of claim 19, wherein the thin-film transistors are low-temperature polycrystalline or oxide thin-film transistors.

\* \* \* \* \*

UNITED STATES PATENT AND TRADEMARK OFFICE
CERTIFICATE OF CORRECTION

PATENT NO. : 11,676,529 B2
APPLICATION NO. : 16/726200
DATED : June 13, 2023
INVENTOR(S) : Khaled Ahmed It is certified that error appears in the above-identified patent and that said Letters Patent is hereby corrected as shown below:

In the Claims

Column 16, Line 52, Claim 1, delete "output signal" and insert --output--.

Signed and Sealed this
Twenty-third Day of January, 2024

Katherine Kelly Vidal
*Director of the United States Patent and Trademark Office*